(12) United States Patent
Zhang et al.

(10) Patent No.: US 11,164,914 B2
(45) Date of Patent: Nov. 2, 2021

(54) MANUFACTURING METHOD OF A DISPLAY PANEL WITH A DISPLAY AREA, DISPLAY PANEL WITH A DISPLAY AREA, AND DISPLAY DEVICE

(71) Applicant: Wuhan Tianma Micro-Electronics Co., Ltd., Wuhan (CN)

(72) Inventors: Guofeng Zhang, Wuhan (CN); Junqiang Wang, Wuhan (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 0 days.

(21) Appl. No.: 16/729,533

(22) Filed: Dec. 30, 2019

(65) Prior Publication Data
US 2021/0098543 A1    Apr. 1, 2021

(30) Foreign Application Priority Data

Sep. 30, 2019 (CN) .......................... 201910944113.X

(51) Int. Cl.
*H01L 29/08* (2006.01)
*H01L 27/32* (2006.01)
(Continued)

(52) U.S. Cl.
CPC ...... *H01L 27/3227* (2013.01); *H01L 27/3246* (2013.01); *H01L 51/001* (2013.01);
(Continued)

(58) Field of Classification Search
CPC . H01L 27/3227; H01L 51/56; H01L 51/5218; H01L 27/3246; H01L 51/001; H01L 51/0023
See application file for complete search history.

(56) References Cited

U.S. PATENT DOCUMENTS 6,194,119 B1 *  2/2001  Wolk ..................... G02B 6/138
                                                    430/200
7,662,425 B2 *  2/2010  Miyashita ........... H01L 27/3211
                                                     427/66
(Continued)

FOREIGN PATENT DOCUMENTS

CN        102282532 A       12/2011
CN        104009059 A        8/2014
(Continued)

*Primary Examiner* — Caleb E Henry
(74) *Attorney, Agent, or Firm* — Kilpatrick Townsend & Stockton, LLP

(57) ABSTRACT

A display panel includes a display area, and the display area includes a first display area and a second display area; the first display area and the second display area each include light-emitting areas, and the second display area further includes light transmissive areas. The manufacturing method includes forming, on a side of a substrate, a light-to-heat conversion layer covering at least a second display area; forming, on a side of the light-to-heat conversion layer facing away from the substrate, a light-emitting functional layer and a second electrode layer each covering the display area, where portions of the second electrode layer which are located in at least adjacent two light-emitting areas are connected; and removing, in at least part of the plurality of light transmissive areas, the light-to-heat conversion layer and all film layers located on a side of the light-to-heat conversion layer facing away from the substrate.

5 Claims, 29 Drawing Sheets

(51) Int. Cl.
*H01L 51/00* (2006.01)
*H01L 51/52* (2006.01)
*H01L 51/56* (2006.01)
*H01L 51/50* (2006.01)

(52) U.S. Cl.
CPC ...... H01L 51/0023 (2013.01); H01L 51/5218 (2013.01); H01L 51/56 (2013.01); *H01L 27/3248* (2013.01); *H01L 51/5012* (2013.01); *H01L 51/5221* (2013.01); *H01L 2227/323* (2013.01)

(56) References Cited

U.S. PATENT DOCUMENTS

| | | | | |
|---|---|---|---|---|
| 9,577,222 | B2* | 2/2017 | Seo | H01L 51/504 |
| 10,978,489 | B2* | 4/2021 | Hirakata | H01L 27/1266 |
| 2007/0176549 | A1* | 8/2007 | Park | H01L 51/524 |
| | | | | 313/512 |
| 2009/0073684 | A1* | 3/2009 | Hsiao | G02F 1/133604 |
| | | | | 362/225 |
| 2009/0085859 | A1* | 4/2009 | Song | G09G 3/3406 |
| | | | | 345/102 |
| 2010/0007268 | A1* | 1/2010 | Kim | H01L 27/3227 |
| | | | | 313/504 |
| 2011/0279414 | A1* | 11/2011 | Noma | G02F 1/1336 |
| | | | | 345/175 |
| 2011/0310611 | A1* | 12/2011 | Cho | G02F 1/133602 |
| | | | | 362/253 |
| 2014/0152632 | A1* | 6/2014 | Shedletsky | G01J 1/4204 |
| | | | | 345/207 |
| 2016/0042702 | A1* | 2/2016 | Hirakata | G09G 3/36 |
| | | | | 345/205 |

FOREIGN PATENT DOCUMENTS

| | | |
|---|---|---|
| CN | 106981585 A | 7/2017 |
| CN | 108649057 A | 10/2018 |

* cited by examiner

MANUFACTURING METHOD OF A DISPLAY PANEL WITH A DISPLAY AREA, DISPLAY PANEL WITH A DISPLAY AREA, AND DISPLAY DEVICE

CROSS-REFERENCES TO RELATED APPLICATIONS

This application claims priority to a Chinese patent application No. 2019/10944113.X filed on Sep. 30, 2019, the disclosure of which is incorporated herein by reference in its entirety.

FIELD

The present disclosure relates to the field of display techniques and, in particular, relates to a manufacturing method of a display panel, a display panel, and a display device.

BACKGROUND

With the development of science and technology and the advancement of society, people are increasingly dependent on the exchange and transmission of information. As a main carrier and material basis of information exchange and transmission, a display has become a hot spot for many scientists.

In order to implement functions such as imaging, it is often necessary to place an optical functional module in a light sensing element setting area. The light transmittance performance of the light sensing element setting area determines how much the external ambient light reaches the optical functional module, and the light transmittance performance of the light sensing element setting area in the related art is poor.

SUMMARY

The present disclosure provides a manufacturing method of a display panel, a display panel and a display device, to achieve the purpose of improving the light transmittance performance of the light sensing element setting area and increasing the transmittance.

Embodiments of the present disclosure provide a manufacturing method of a display panel. The display panel includes a display area, and the display area includes a first display area and a second display area; the second display area is reused as a light sensing element setting area. The first display area and the second display area each include a plurality of light-emitting areas, and the second display area further includes a plurality of light transmissive areas. The manufacturing method includes steps described below.

A substrate is provided.

A light-to-heat conversion layer covering at least the second display area is formed on a side of the substrate.

A light-emitting functional layer and a second electrode layer each covering the display area are formed on a side of the light-to-heat conversion layer facing away from the substrate via evaporation, where portions of the second electrode layer which are located in at least adjacent two light-emitting areas are connected.

The light-to-heat conversion layer and all film layers located on a side of the light-to-heat conversion layer facing away from the substrate in at least part of the light transmissive areas are removed via laser irradiation.

Embodiments of the present disclosure provide a display panel. The display panel includes a display area, and the display area includes a first display area and a second display area; the second display area is reused as a light sensing element setting area. The first display area and the second display area each include a plurality of light-emitting areas, and the second display area further includes a plurality of light transmissive areas. The display panel includes: a substrate, and a light-to-heat conversion layer, a light-emitting functional layer, and a second electrode layer.

The light-to-heat conversion layer, the light-emitting functional layer, and the second electrode layer are located on a side of the substrate and sequentially disposed, and portions of the second electrode layer which are located in at least adjacent two light-emitting areas are connected.

The light-to-heat conversion layer, the light-emitting functional layer, and the second electrode layer are not overlapped with at least part of the light transmissive areas.

Embodiments of the present disclosure provide a display device. The display device includes the display panel described in another embodiment and a light sensing element located in the second display area. The light sensing element is located on a side of the substrate facing away from the light-to-heat conversion layer, and a photosensitive surface of the light sensing element faces toward the substrate.

In the manufacturing method of the display panel provided in the embodiments of the present disclosure, a light-to-heat conversion layer is firstly formed in the second display area, and then a light-emitting functional layer and a second electrode layer are formed on the light-to-heat conversion layer. When a light transmissive area of the second display area is irradiated with laser, the light-to-heat conversion layer converts light energy into thermal energy under laser irradiation and is thermally expanded and detached, and all film layers located on the light-to-heat conversion layer are peeled off from the substrate when the light-to-heat conversion layer is detached. Since the light-emitting functional layer and the second electrode layer of the light transmissive area are peeled off from the substrate, the light transmittance performance of the light transmissive area is improved, that is, the light transmittance of the light transmissive area is increased, and the light transmittance performance of the light sensing element setting area is improved, to achieve the purpose of increasing the transmittance.

DETAILED DESCRIPTION

Figure 1:
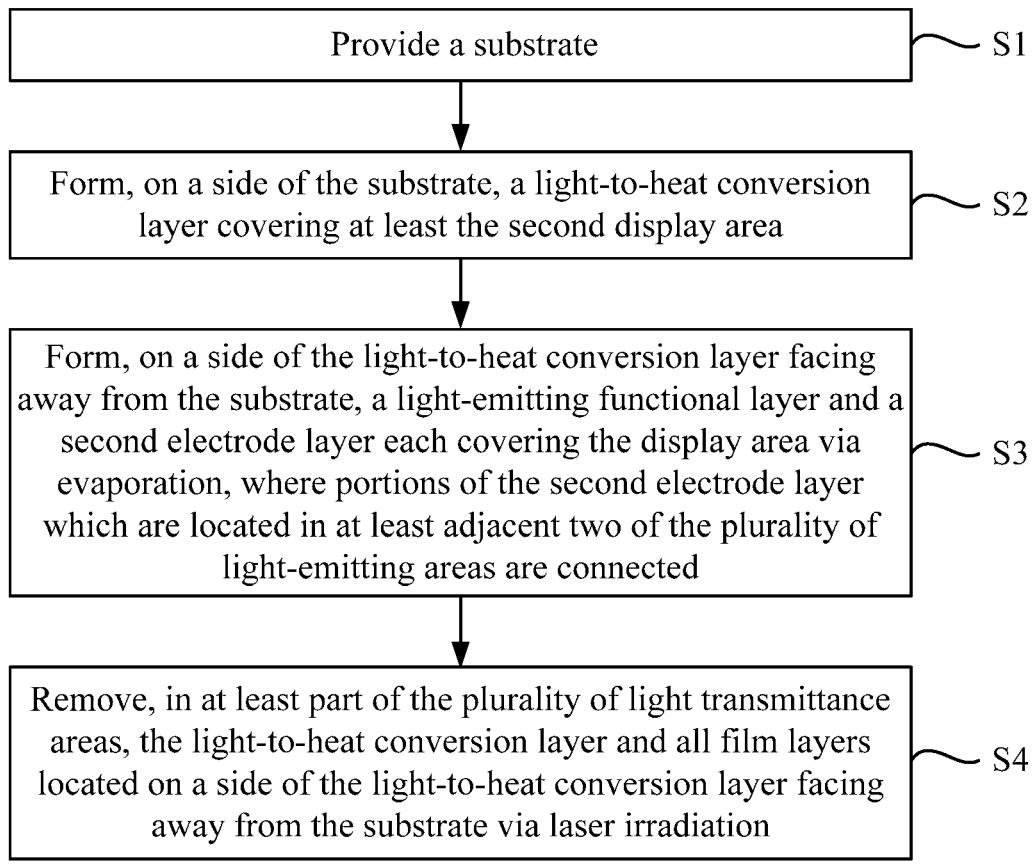
FIG. 1 is a flowchart illustrating a manufacturing method of a display panel according to an embodiment of the present disclosure.

Hereinafter the present disclosure will be further described in detail in conjunction with the drawings and embodiments. It is to be understood that the specific embodiments set forth below are merely intended to illustrate and not to limit the present disclosure. Additionally, it is to be noted that, for ease of description, only part, not all, of the structures related to the present disclosure are illustrated in the drawings.

In the related art, an organic light-emitting diode in an organic light-emitting display panel includes an anode, a cathode, and a light-emitting layer located between the anode and the cathode. When the organic light-emitting display panel operates, the cathode of each organic light-emitting diode receives a power signal of the same potential. Therefore, the cathodes of all organic light-emitting diodes in the organic light-emitting display panel are generally formed via evaporation, that is, the cathodes of a plurality of organic light-emitting diodes are integrally connected. When the light sensing element is integrated in the display device and is disposed in the display area, the requirement for the light transmittance of the display panel is high, and the cathodes provided in the entire layer have a large influence on the light transmittance of the display panel. In order to increase the light transmittance, it is necessary to form a patterned cathode, that is, to provide the cathode in an area where the organic light-emitting diode is located, and not to provide a cathode pattern in an area between two adjacent organic light-emitting diodes. When the cathode pattern is evaporated by using a mask, the position of the mask where the cathode pattern is not provided needs to be provided with a blocking structure, and the opening position of the mask corresponds to the position where the cathode pattern is formed. Since the cathodes of the plurality of organic light-emitting diodes need to be integrated, correspondingly, each blocking structure on the mask needs to float independently of each other, and such a mask cannot be really achieved. Therefore, how to achieve the patterning of the cathode formed via evaporation has become a problem to be solved in the related art. The manufacturing method of the display panel, the display panel, and the display device provided by the present application are used to at least solve the above problem.

FIG. 1 is a flowchart illustrating a manufacturing method of a display panel according to an embodiment of the present disclosure, and FIGS. 2 to 6 are schematic diagrams illustrating a manufacturing process of the display panel corresponding to the manufacturing method of the display panel of FIG. 1. Referring to FIG. 1 and FIGS. 2 to 6, the display panel includes a display area, and the display area includes a first display area A11 and a second display area A12. The second display area A12 is reused as a light sensing element setting area. The first display area A11 and the second display area A12 each include a plurality of light-emitting areas A13 for displaying an image. The second display area A12 further includes a plurality of light transmissive areas A14 that can transmit light incident from one side of the display panel to another side of the display panel. The manufacturing method of the display panel includes steps described below.

In S1, a substrate 1 is provided.

Figure 2:
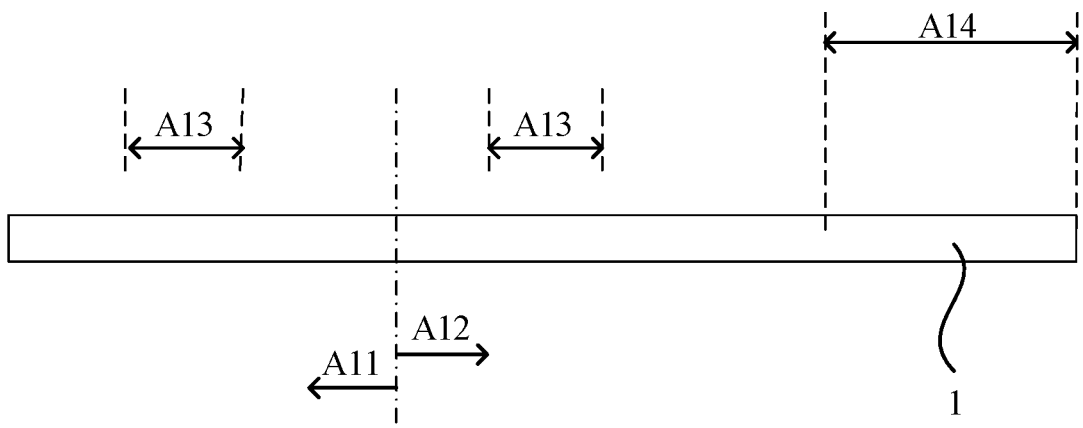
FIGS. 2 to 6 are schematic diagrams illustrating a manufacturing process of the display panel corresponding to the manufacturing method of the display panel of FIG. 1.

Referring to FIG. 2, the substrate 1 is provided. The substrate 1 may be a rigid substrate, which may be, for example, a glass substrate. The substrate 1 may also be a flexible substrate, which may be, for example, a polyimide substrate.

In S2, a light-to-heat conversion layer 2 covering at least the second display area A12 is formed on a side of the substrate 1.

Figure 3:
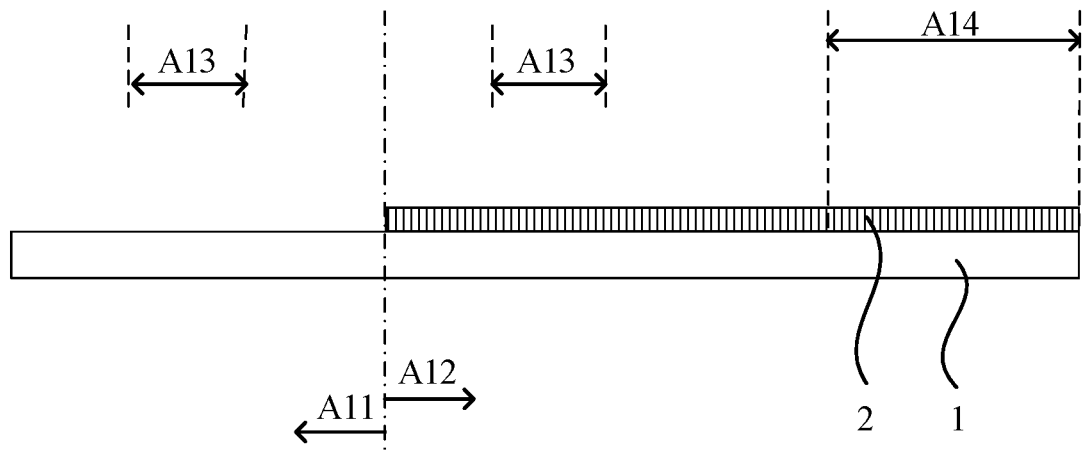

Referring to FIG. 3, the light-to-heat conversion layer 2 covers the second display area A12. In other embodiments, the light-to-heat conversion layer 2 may also cover the second display area A12 and the first display area A11.

In S3, a light-emitting functional layer 3 and a second electrode layer 4 each covering the display area are formed via evaporation on a side of the light-to-heat conversion layer 2 facing away from the substrate 1, where portions of the second electrode layer 4 which are located in at least adjacent two light-emitting areas A13 are connected.

Figure 4:
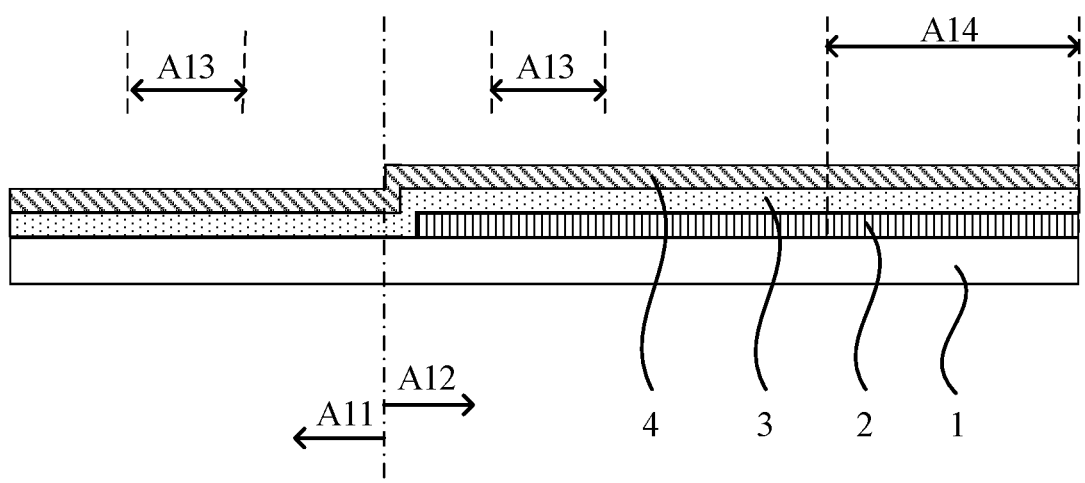

Referring to FIG. 4, the light-emitting functional layer 3 and the second electrode layer 4 which are laid over the entire surface are formed on a side of the light-to-heat conversion layer 2 facing away from the substrate 1, and the light-emitting functional layer 3 and the second electrode layer 4 each cover the first display area A11 and the second display area A12.

In S4, in at least part of the light transmissive areas A14, the light-to-heat conversion layer 2 and all film layers located on a side of the light-to-heat conversion layer 2 facing away from the substrate 1 are removed via laser irradiation.

Figure 5:
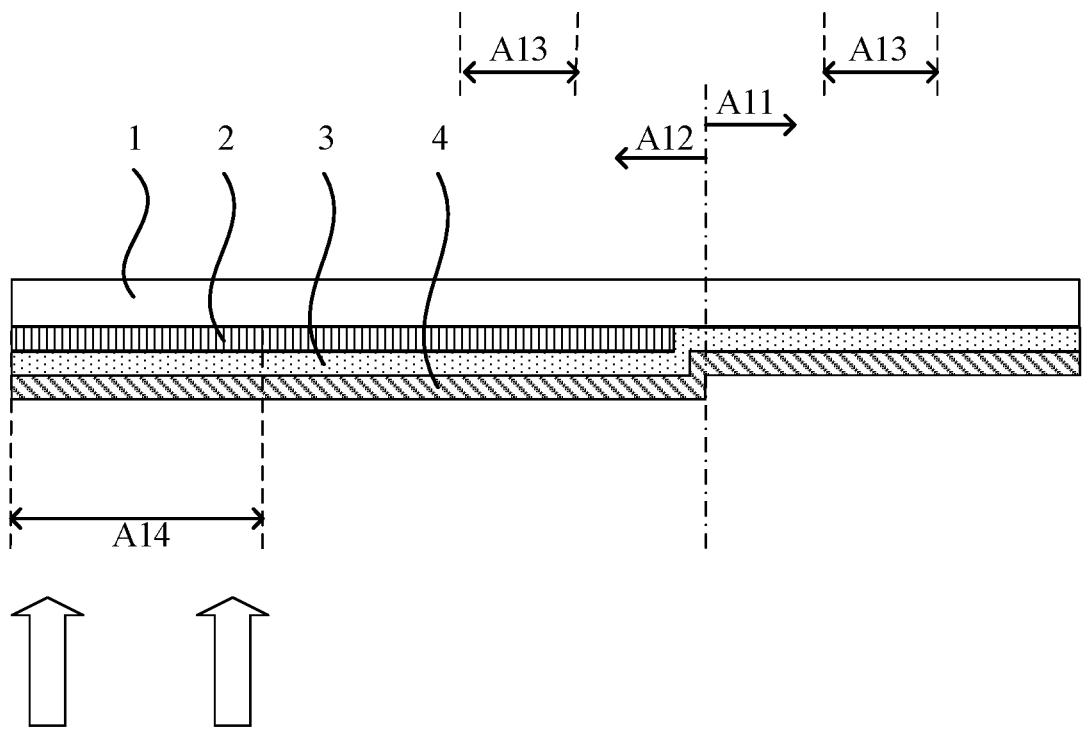
Figure 6:
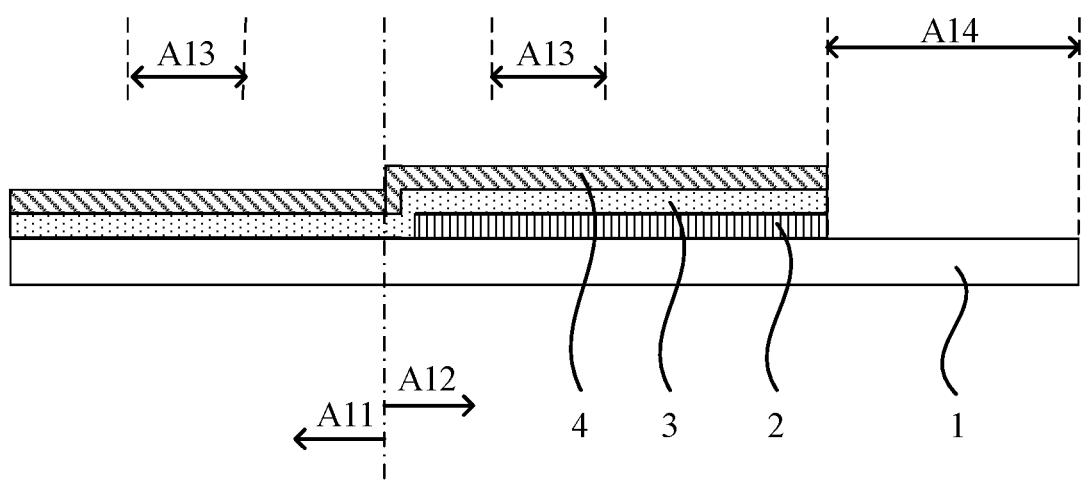

Referring to FIG. 5 and FIG. 6, the light transmissive area A14 (in the figure, one light transmissive area A14 is exemplified, the second display area A12 may include one or more light transmissive areas A14, and when the second display area A12 includes a plurality of light transmissive areas A14, at least one light transmissive area A14 may be irradiated with laser) is irradiated with laser to remove all film layers located on a side of the light-to-heat conversion layer 2 facing away from the substrate 1.

In the manufacturing method of the display panel provided in the embodiments of the present disclosure, the light-to-heat conversion layer is firstly formed in the second display area, and then the light-emitting functional layer and the second electrode layer are formed on the light-to-heat conversion layer. When the light transmissive area of the second display area is irradiated with laser, the light-to-heat conversion layer converts light energy into thermal energy under laser irradiation and is thermally expanded and detached, and all film layers located on the light-to-heat conversion layer are peeled off from the substrate when the light-to-heat conversion layer is detached. Since the light-emitting functional layer and the second electrode layer of the light transmissive area are peeled off from the substrate, the light transmittance performance of the light transmissive area is improved, that is, the light transmittance of the light transmissive area is increased and the light transmittance performance of the light sensing element setting area is improved, to achieve the purpose of increasing the transmittance.

Figure 7:
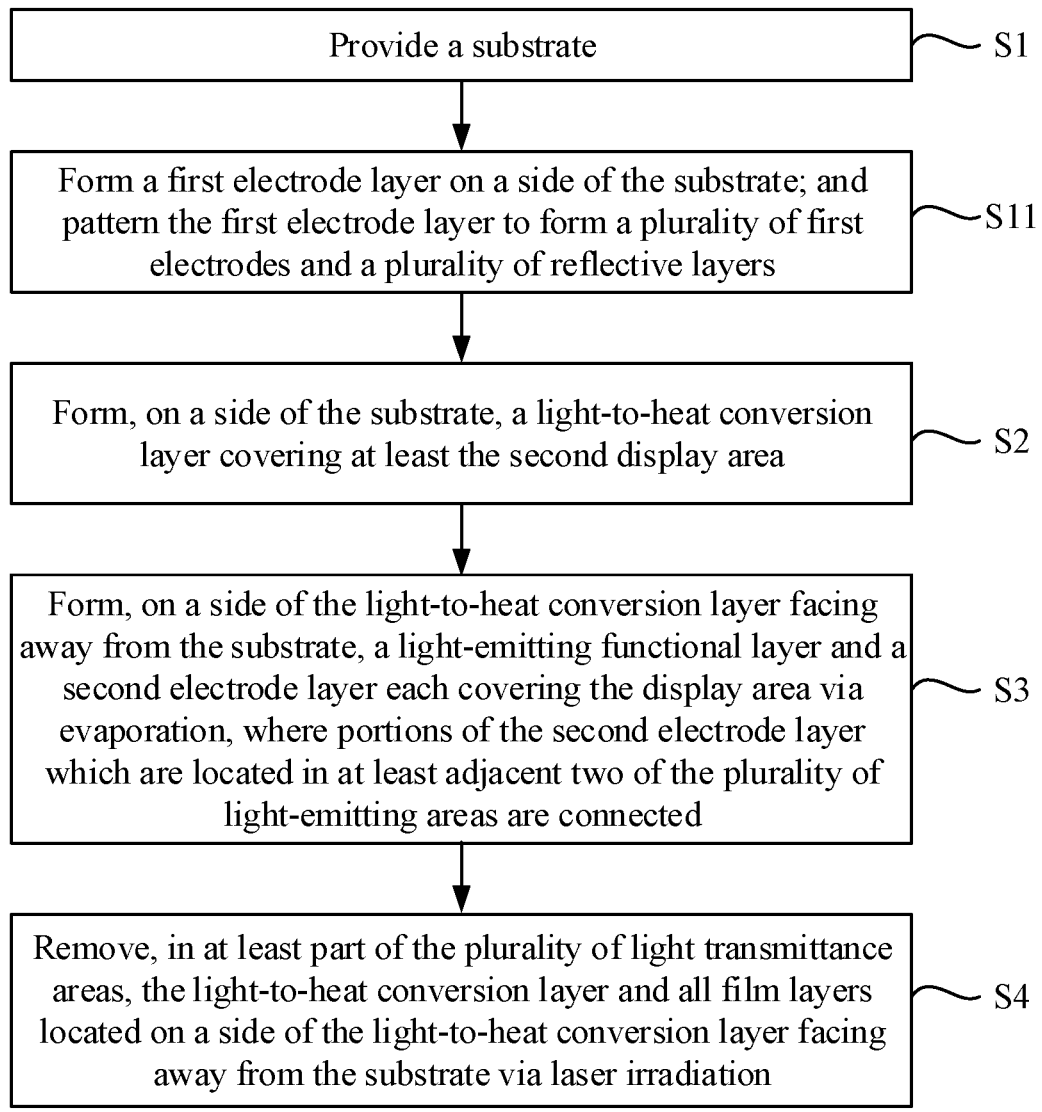
FIG. 7 is a flowchart illustrating another manufacturing method of a display panel according to an embodiment of the present disclosure.
Figure 8:
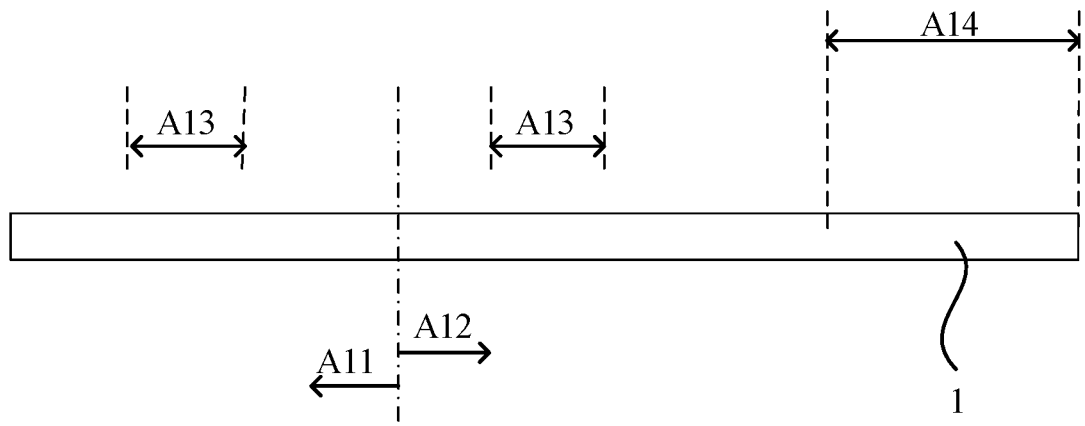
FIGS. 8 to 17 are schematic diagrams illustrating a manufacturing process of the display panel corresponding to the manufacturing method of the display panel of FIG. 7.

FIG. 7 is a flowchart illustrating another manufacturing method of a display panel according to an embodiment of the present disclosure, and FIGS. 8 to 17 are schematic diagrams illustrating a manufacturing process of the display panel corresponding to the manufacturing method of the display panel of FIG. 7. Referring to FIG. 7 and FIGS. 8 to 17, the manufacturing method of the display panel includes steps described below.

In S1, a substrate 1 is provided.

In S11, a first electrode layer 50 is formed on a side of the substrate 1. The first electrode layer 50 is patterned to form a plurality of first electrodes 5 and a plurality of reflective layers 8.

A first electrode 5 is located at least in a light-emitting area A13, and is not overlapped with a light transmissive area A14, and a reflective layer 8 is located at an edge of a respective one of at least part of light transmissive areas A14.

Figure 9:
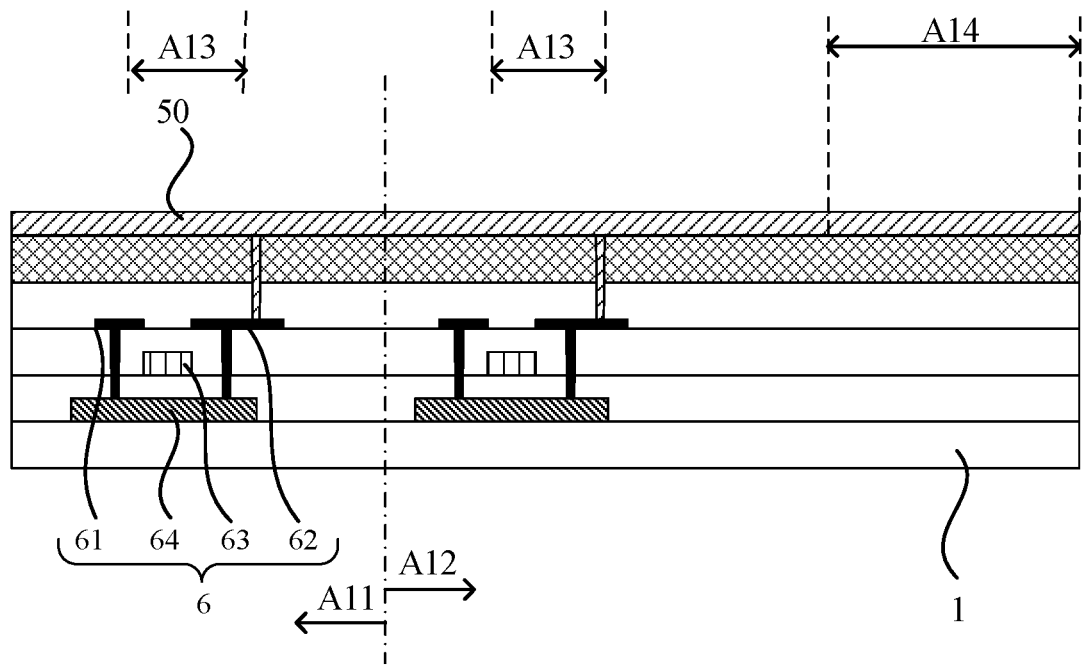

Referring to FIG. 9, the first electrode layer 50 covering the first display area A11 and the second display area A12 is formed on the side of the substrate 1.

Figure 10:
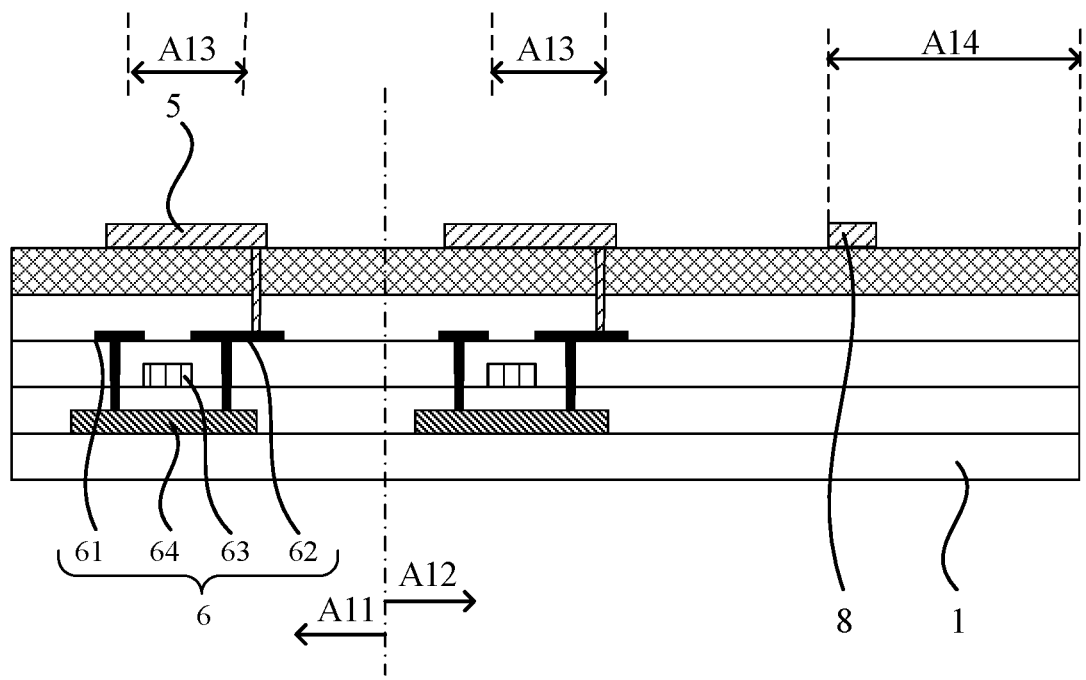

Referring to FIG. 10, the first electrode layer 50 is patterned to form a plurality of first electrodes 5 and a plurality of reflective layers 8. At least a portion of the first electrode 5 is located in the light-emitting area A13 of the first display area A11 or in the light-emitting area A13 of the second display area A12, and a reflective layer 8 is located in a light transmissive area A14 and at the edge of the light transmissive area A14. The first electrodes 5 and the reflective layers 8 are disposed in the same layer and are formed in the same process using the same material, which simplifies the process.

The light-emitting functional layer 3 is located between the first electrode 5 and the second electrode layer 4. Under the action of an applied electric field, an electron and a hole are respectively injected from the second electrode layer 4 and the first electrode 5 into the light-emitting functional layer 3, and recombined to generate an exciton. The exciton migrates under the action of an applied electric field, and the energy is transferred to a light-emitting molecule in the light-emitting functional layer 3, and the electron is excited to transition from a ground state to an excited state. The excited state energy is released by means of radiation transition, and light is generated.

In S2, a light-to-heat conversion layer 2 covering at least the second display area A12 is formed on a side of the substrate 1.

In S3, the light-emitting functional layer 3 and the second electrode layer 4 each covering the display area are formed via evaporation on a side of the light-to-heat conversion layer 2 facing away from the substrate 1, where portions of the second electrode layer 4 which are located in at least adjacent two light-emitting areas A13 are connected.

In S4, in at least part of the light transmissive areas A14, the light-to-heat conversion layer 2 and all film layers located on a side of the light-to-heat conversion layer 2 facing away from the substrate 1 are removed via laser irradiation.

In the embodiment of the present disclosure, the first electrode layer is formed before the light-to-heat conversion layer is formed, and the first electrode layer is patterned to simultaneously form the first electrodes and the reflective layers, saving the process. A reflective layer is located at an edge of a respective one of at least part of the light transmissive areas and between the light-to-heat conversion layer and the substrate. When the light-to-heat conversion layer in the light transmissive area is irradiated with the laser, the reflective layer reflects the light transmitted through the light-to-heat conversion layer to the light-to-heat conversion layer again, improving the utilization rate of the irradiation laser, accelerating the expansion rate of the light-to-heat conversion layer at the edge of the light transmissive area, facilitating the detachment of the light-to-heat conversion layer and all film layers located on a side of the light-to-heat conversion layer facing away from the substrate in the light transmissive area, and the reflective layer is merely located at the edge of the light transmissive area, which reduces the influence on the light transmittance of the light transmissive area. In other embodiments, mere the first electrode layer may be patterned to form the first electrode.

In one embodiment, referring to FIG. 9, before the first electrode layer 50 is formed on a side of the substrate 1, the manufacturing method of the display panel further includes forming a thin film transistor layer 6 on a side of the substrate 1, the thin film transistor layer 6 may include a plurality of thin film transistors, and each thin film transistor may include a source electrode 61, a drain electrode 62, a gate electrode 63, and a semiconductor layer 64. The light transmissive area A14 is not overlapped with the thin film transistors in the thin film transistor layer 6.

Figure 11:
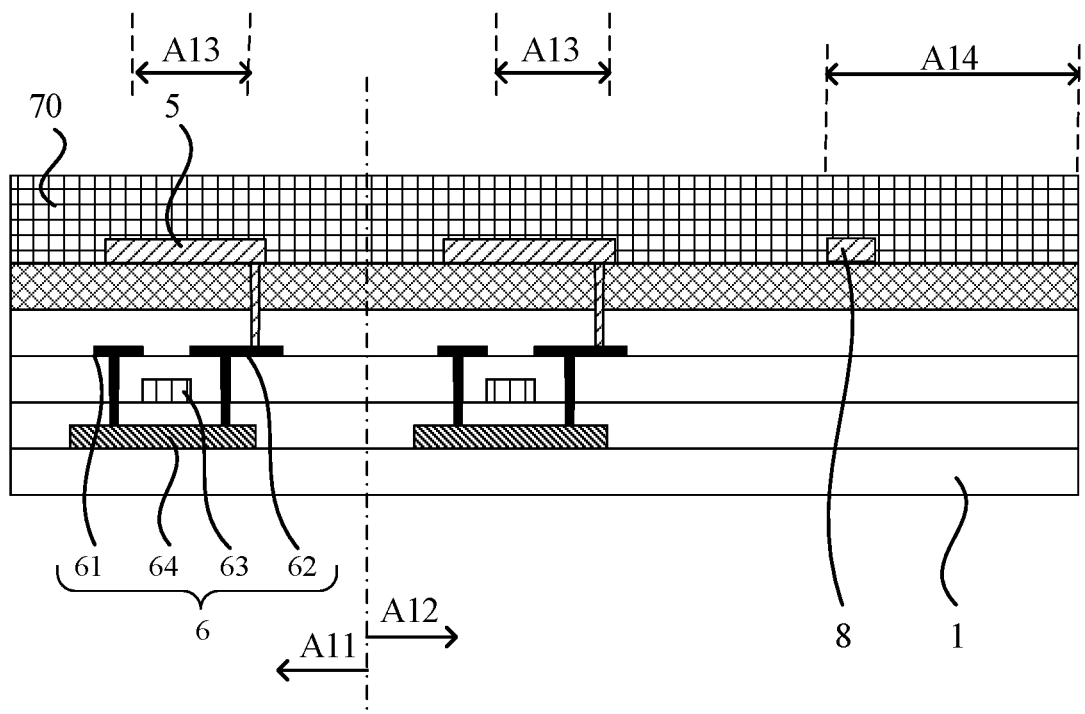
Figure 12:
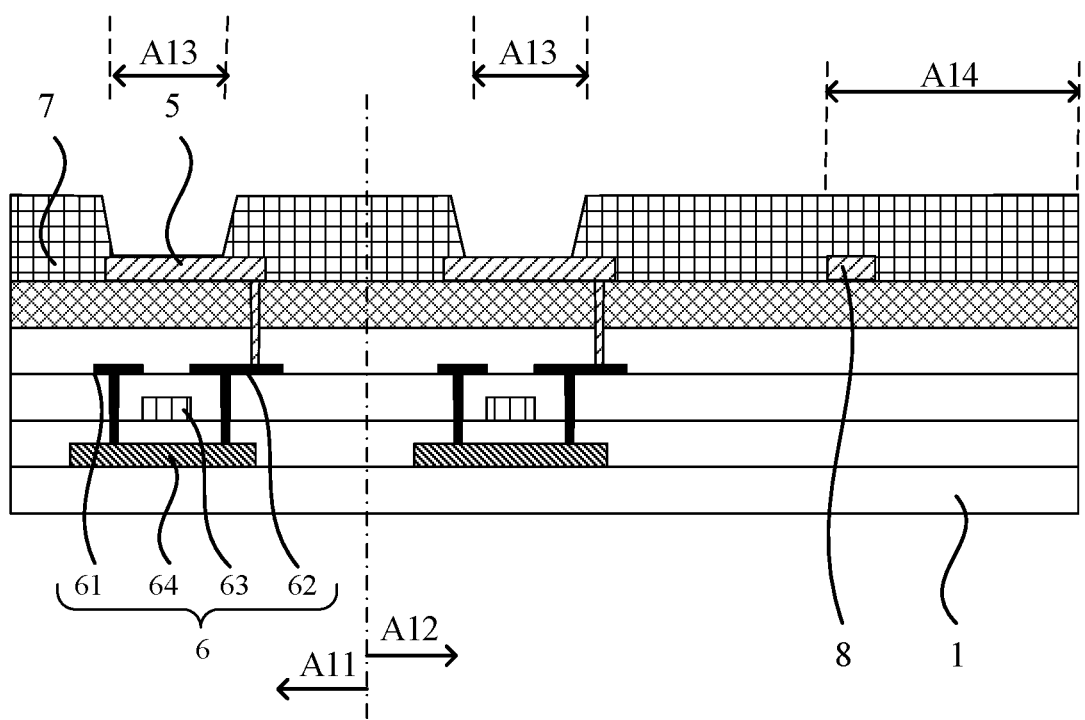

In one embodiment, referring to FIG. 11 and FIG. 12, after the first electrode layer 50 is patterned to form the plurality of first electrodes 5 and the plurality of reflective layers 8, the manufacturing method of the display panel may further include that a pixel defining film layer 70 covering the first display area A11 and the second display area A12 is formed on a side of the first electrode 5 facing away from the substrate 1 and that the pixel defining film layer 70 is patterned to form the pixel defining layer 7, where the pixel defining layer 7 is provided with a plurality of openings, and an opening is located in a light-emitting area A13. The light-emitting functional layer 3 and second electrode layer 4 formed in the opening of the pixel defining layer 7 together with the first electrode 5 form a light-emitting unit, and the area where the light-emitting unit is located is the light-emitting area A13.

Figure 13:
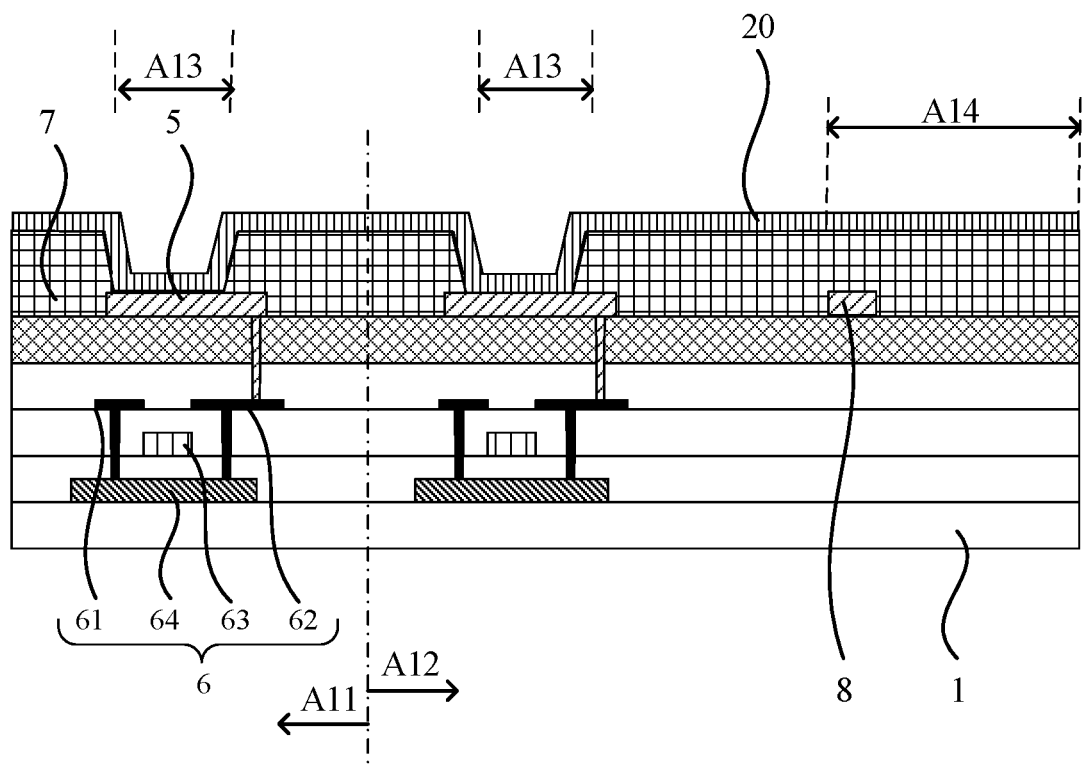
Figure 14:
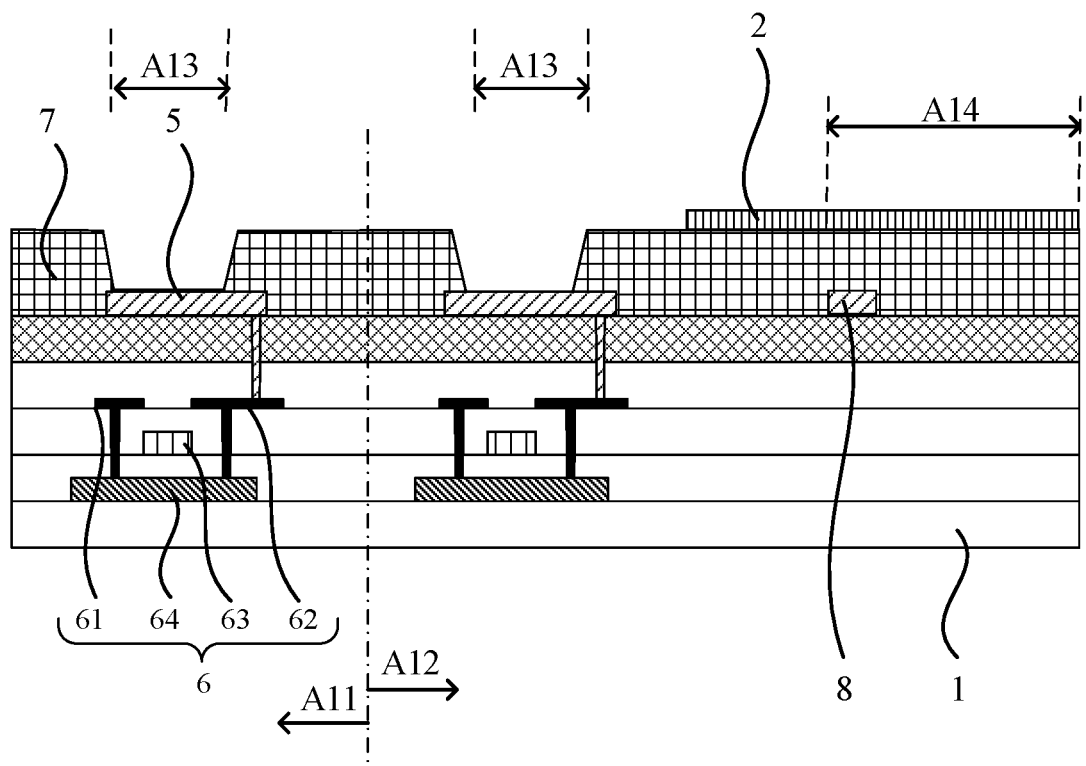
Figure 15:
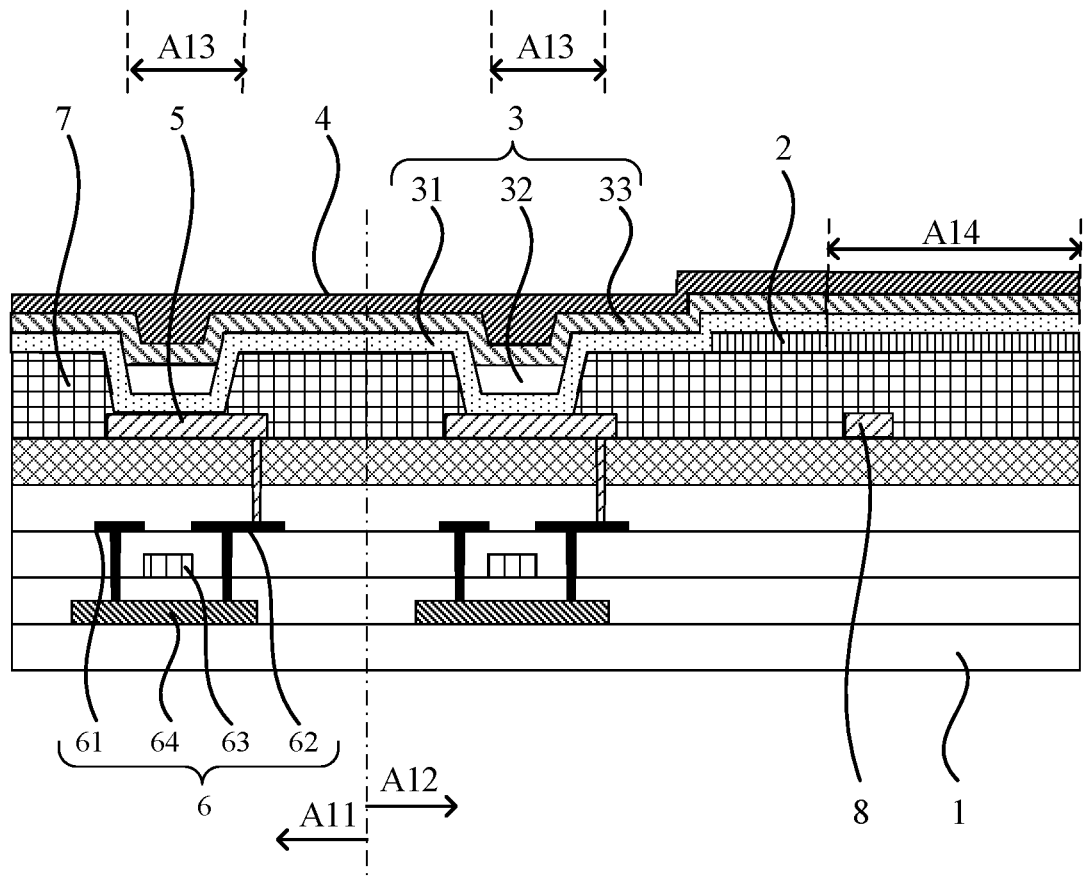

In one embodiment, referring to FIG. 13 and FIG. 14, the step of forming the light-to-heat conversion layer 2 covering at least the second display area A12 on the side of the substrate 1 includes that a light-to-heat conversion film layer 20 is formed on the side of the substrate 1, and that the light-to-heat conversion film layer 20 is patterned to form the light-to-heat conversion layer 2, where the light-to-heat conversion layer 2 is not overlapped with the light-emitting area A13. It should be noted that the light-to-heat conversion film layer 20 formed on the side of the substrate 1 may cover the second display area A12, or the light-to-heat conversion film layer 20 formed on the side of the substrate 1 may cover the first display area A11 and the second display area A12, which is not limited in the embodiments of the present disclosure. In the embodiment of the present disclosure, due to the patterning processing of the light-to-heat conversion film layer 20, the light-to-heat conversion layer 2 obtained after the light-to-heat conversion film layer 20 is patterned is not overlapped with the light-emitting area A13, and the case of adverse influence of the light-to-heat conversion layer 2 on light-emitting display is avoided, and the display effect of the display panel is ensured. In other embodiments, the light-to-heat conversion layer 2 merely covering the light transmissive area A14 in the second display area A12 may be formed on a side of the substrate 1. At this moment, since the light-to-heat conversion layer 2 is formed merely in the light transmissive area A14 and is not formed in an area other than the light transmissive area A14, when the light-to-heat conversion layer 2 of the light transmissive area A14 is irradiated with laser, the light-to-heat conversion layer 2 in the light transmissive area A14 is not subjected to the pulling force of the film layer in the area other than the light transmissive area A14 (if the light-to-heat conversion layer 2 is located both in the light transmissive area A14 and in the area other than the light transmissive area A14, the light-to-heat conversion layer 2 in the light transmissive area A14 is subjected to the pulling force of the light-to-heat conversion layer 2 which is integrally connected to the light-to-heat conversion layer 2 in the light transmissive area A14, which does not expand, and which is located outside the light transmissive area A14), which facilitates direct thermal expansion and detachment.

Figure 16:
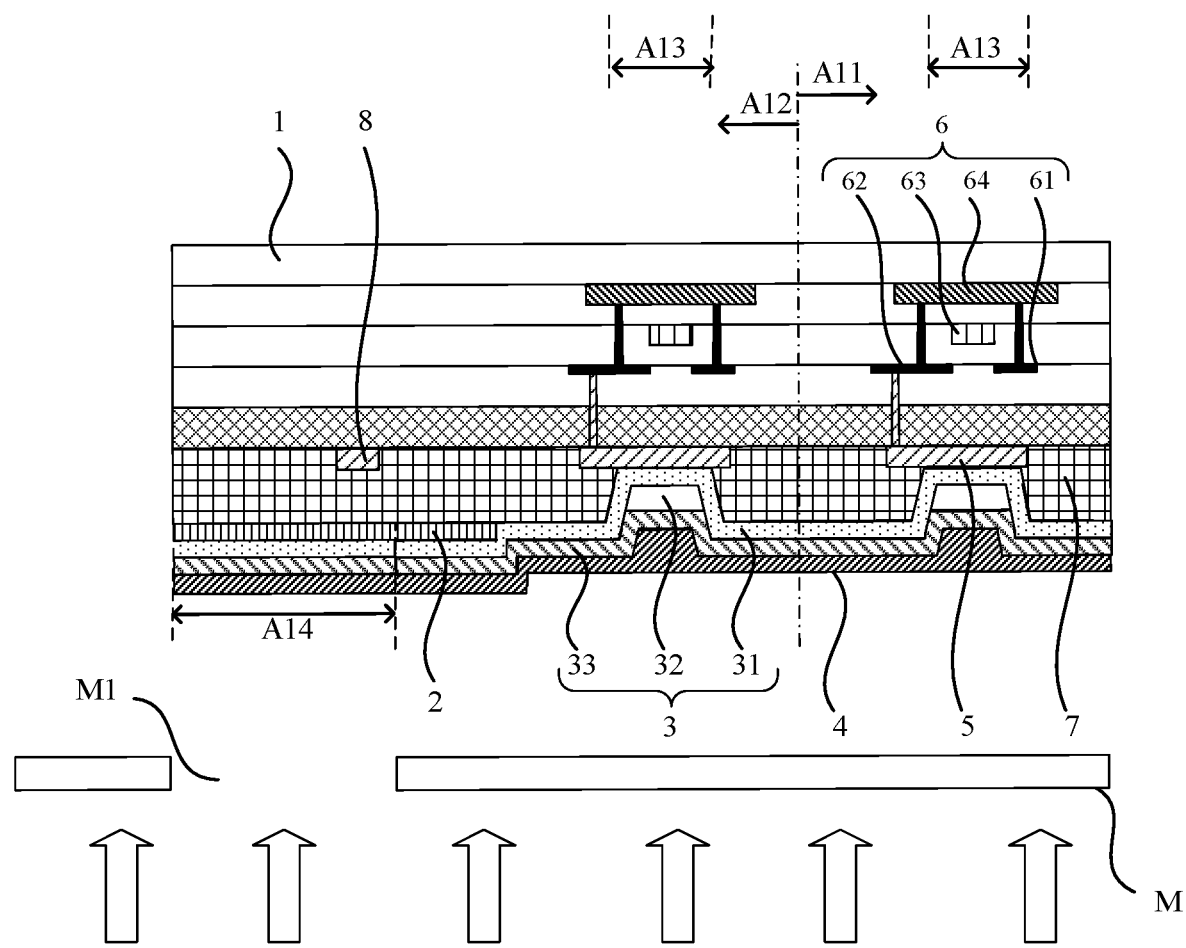
Figure 17:
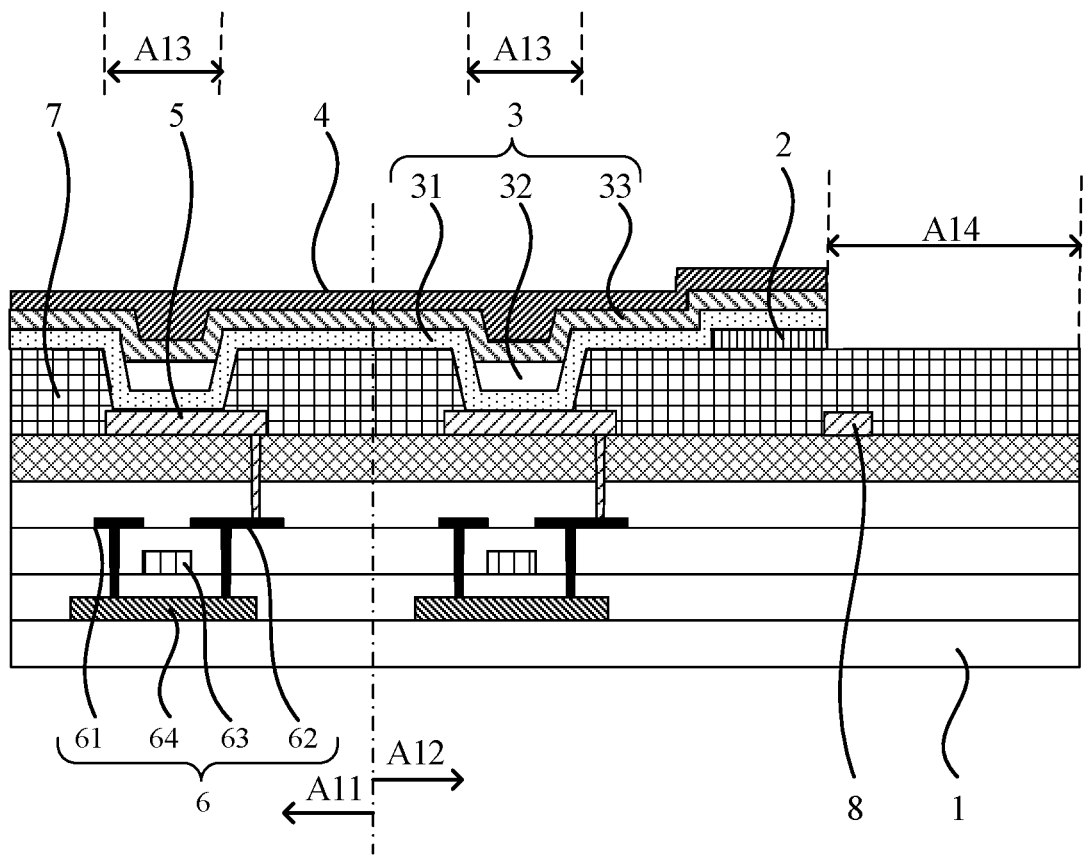

In one embodiment, referring to FIG. 16 and FIG. 17, in at least part of the light transmissive areas A14, the step of removing the light-to-heat conversion layer 2 and all film layers located on the side of the light-to-heat conversion layer 2 facing away from the substrate 1 via laser irradiation includes: removing the light-to-heat conversion layer 2 and all film layers located on the side of the light-to-heat conversion layer 2 facing away from the substrate 1 in at least part of the light transmissive areas A14 via laser irradiation using a mask M. Hollow patterns M1 of the mask M are configured to expose at least part of the light transmissive areas A14.

Exemplarily, referring to FIGS. 16 and 17, when laser irradiation is used, the mask M may be used to block the light-emitting areas A13 in the first display area A11 and the second display area A12, which prevents the laser from damaging the light-emitting functional layer 3 in the light-emitting area A13s and affecting the light-emitting display function. Moreover, the hollow pattern M1 of the mask M exposes the light transmissive area A14 to allow the laser to irradiate the light-to-heat conversion layer 2 of the light transmissive area A14. When laser irradiation is used, the light-emitting functional layer 3 and the second electrode layer 4 are located between the light-to-heat conversion layer 2 and the mask M. Moreover, the substrate 1 provided with the light-to-heat conversion layer 2 may be inverted, and the thermally expanded light-to-heat conversion layer 2 in the light transmissive area A14 is peeled off from the substrate 1 under the action of gravity.

Figure 18:
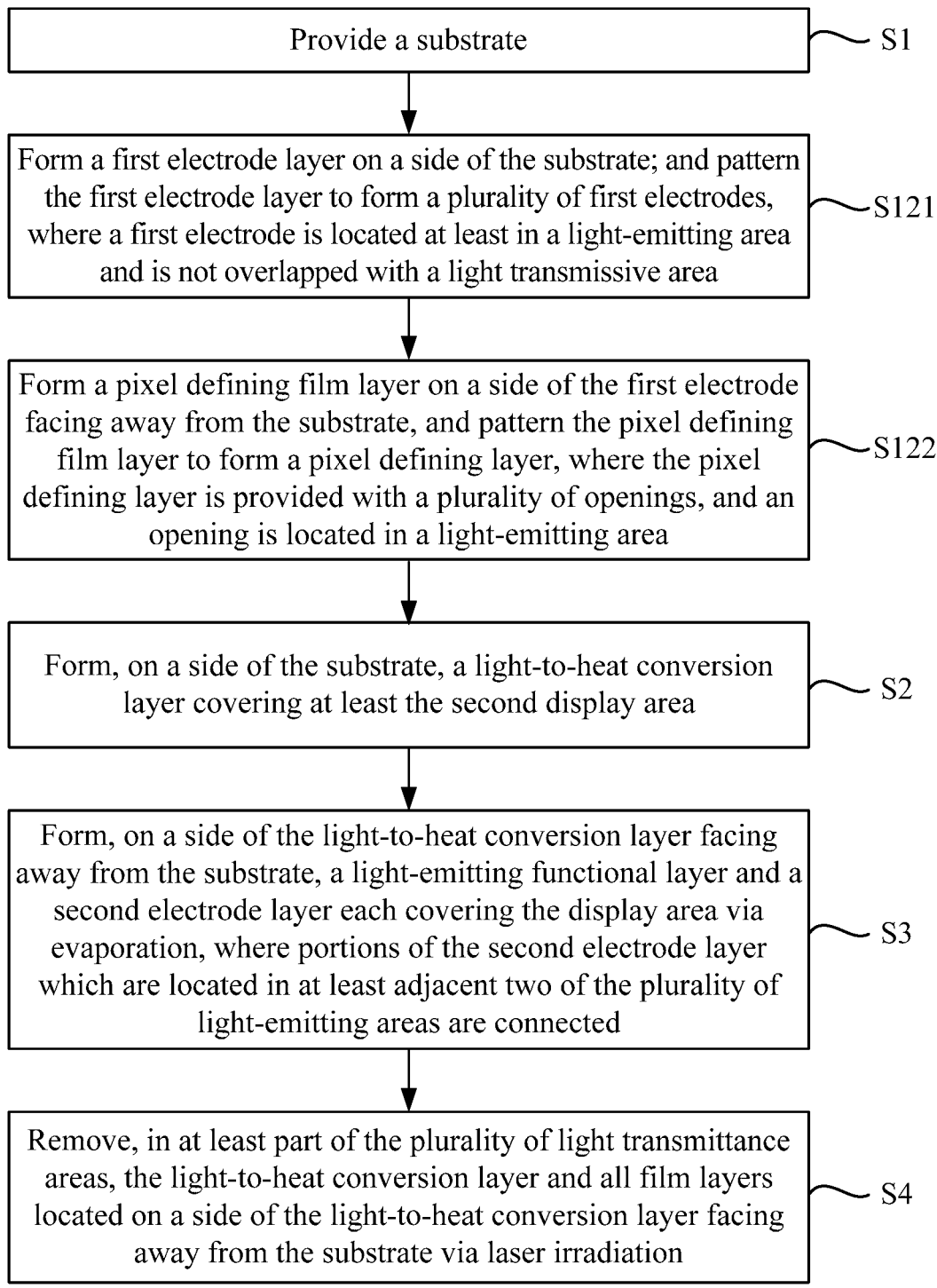
FIG. 18 is a flowchart illustrating another manufacturing method of a display panel according to an embodiment of the present disclosure.
Figure 19:
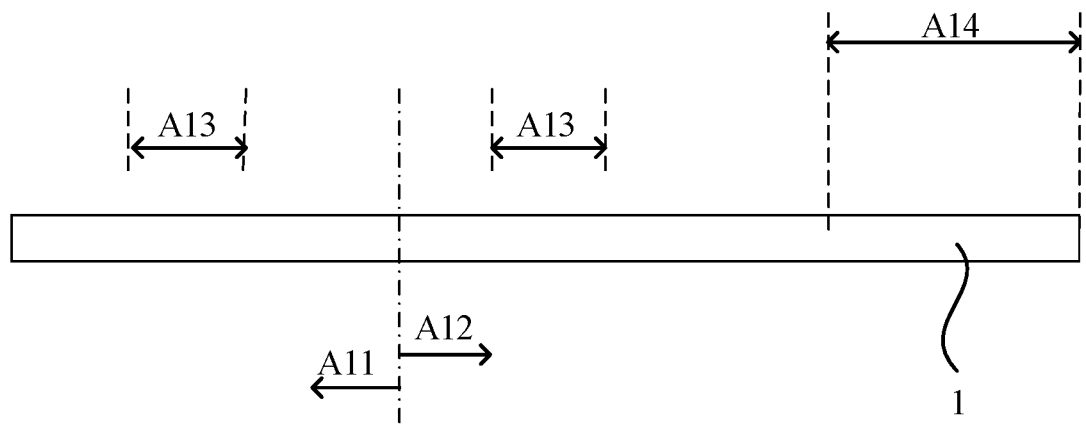
FIGS. 19 to 28 are schematic diagrams illustrating a manufacturing process of the display panel corresponding to the manufacturing method of the display panel of FIG. 18.

FIG. 18 is a flowchart illustrating another manufacturing method of a display panel according to an embodiment of the present disclosure, and FIGS. 19 to 28 are schematic diagrams illustrating a manufacturing process of the display panel corresponding to the manufacturing method of the display panel of FIG. 18. Referring to FIG. 18 and FIGS. 19 to 28, the manufacturing method of the display panel includes steps described below.

In S1, a substrate 1 is provided.

In S121, a first electrode layer 50 is formed on a side of the substrate 1, and the first electrode layer 50 is patterned to form a plurality of first electrodes 5, and a first electrode 5 is located at least in a light-emitting area A13 and is not overlapped with a light transmissive area A14.

Figure 20:
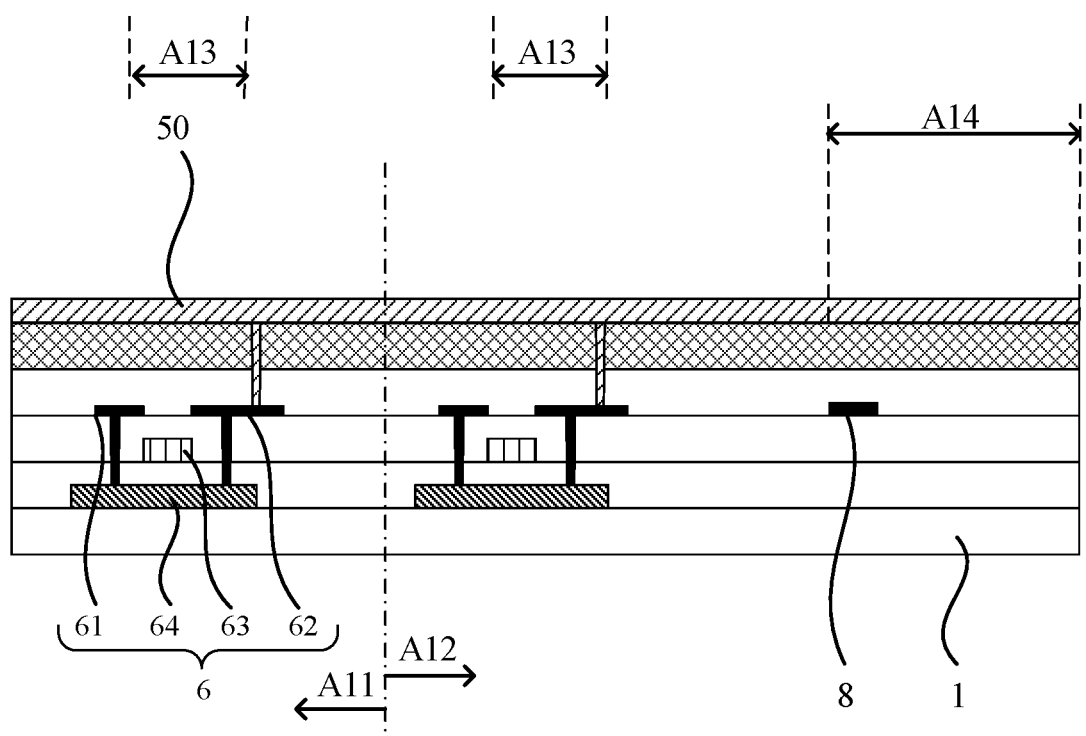

Referring to FIG. 20, the first electrode layer 50 covering the first display area A11 and the second display area A12 is formed on the side of the substrate 1.

Figure 21:
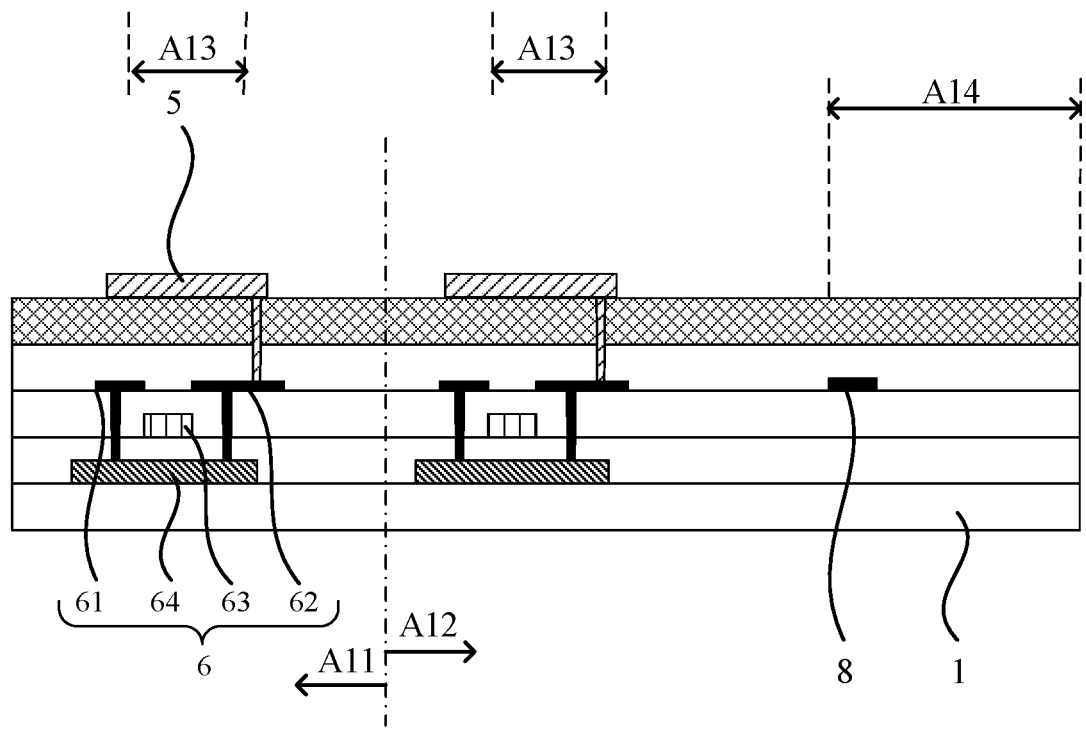

Referring to FIG. 21, the first electrode layer 50 is patterned to form a plurality of first electrodes 5. At least a portion of the first electrode 5 is located in the light-emitting area A13 of the first display area A11 or in the light-emitting area A13 of the second display area A12.

In S122, a pixel defining film layer 70 is formed on a side of the first electrode 5 facing away from the substrate 1, and the pixel defining film layer 70 is patterned to form a pixel defining layer 7, where the pixel defining layer 7 is provided with a plurality of openings, and an opening is located in a light-emitting area A13.

Figure 22:
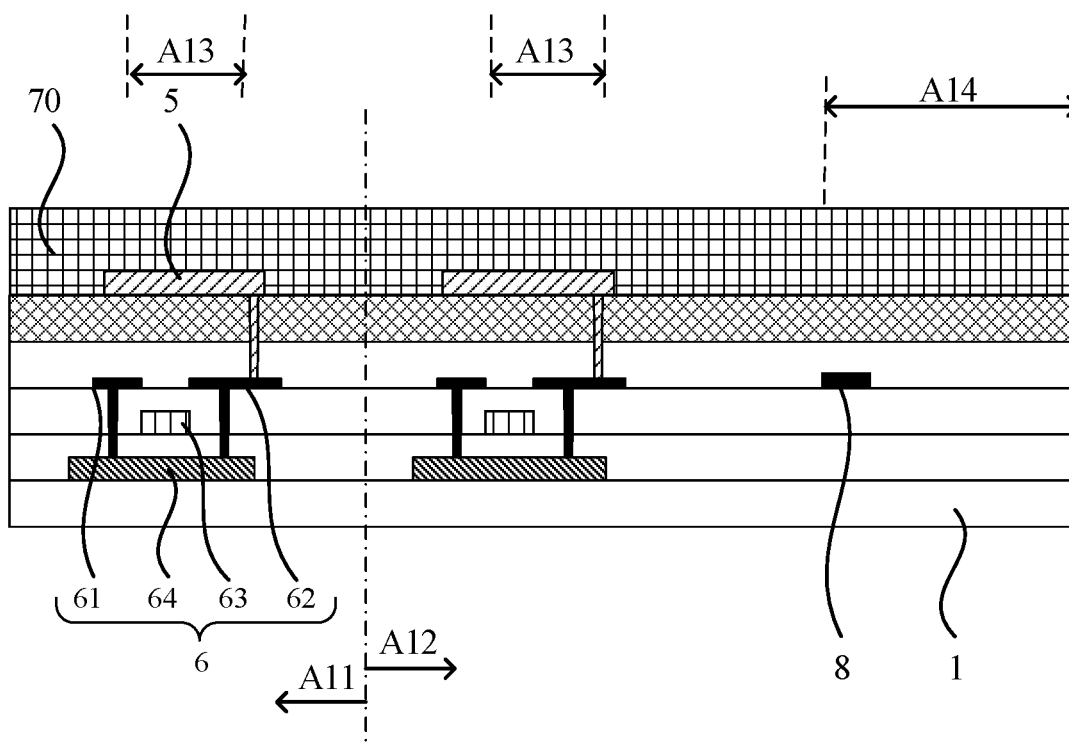
Figure 23:
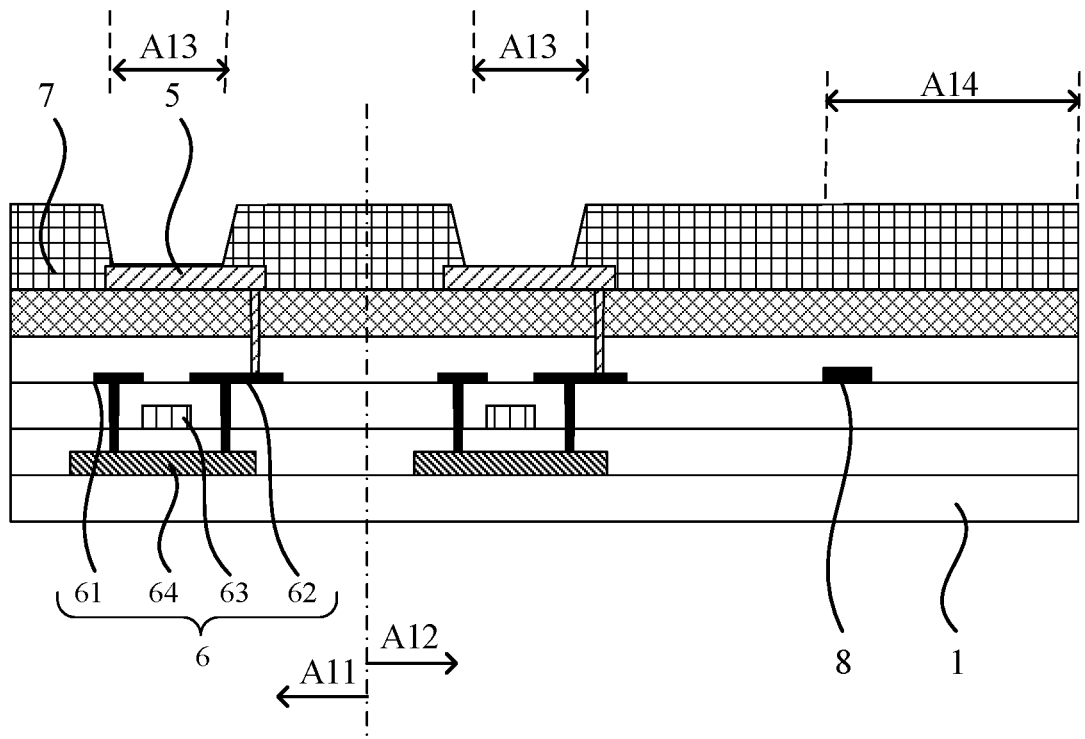

Referring to FIG. 22 and FIG. 23, the pixel defining film layer 70 is formed on the side of the first electrode 5 facing away from the substrate 1, and the pixel defining film layer 70 is patterned to form the pixel defining layer 7. The opening is located in the light-emitting area A13 and exposes the first electrode 5.

In S2, a light-to-heat conversion layer 2 covering at least the second display area A12 is formed on a side of the substrate 1.

In S3, a light-emitting functional layer 3 and a second electrode layer 4 each covering the display area are formed via evaporation on a side of the light-to-heat conversion layer 2 facing away from the substrate 1, where portions of the second electrode layer 4 which are located in at least adjacent two light-emitting areas A13 are connected.

In S4, in at least part of the light transmissive areas A14, the light-to-heat conversion layer 2 and all film layers located on a side of the light-to-heat conversion layer 2 facing away from the substrate 1 are removed via laser irradiation.

In the embodiment of the present disclosure, the first electrode layer is formed before the light-to-heat conversion layer is formed, and the first electrode layer is patterned to form the first electrode. The pixel defining layer is also formed before the formation of the light-to-heat conversion layer and after the formation of the first electrode. Since the pixel defining layer is formed before the formation of the light-to-heat conversion layer, the pixel defining layer is located between the light-to-heat conversion layer and the substrate, and the pixel defining layer does not cover the light-to-heat conversion layer, so the thermal expansion and detachment of the light-to-heat conversion layer in the light transmissive area under laser irradiation is not affected.

In one embodiment, referring to FIG. 20, before the first electrode layer 50 is formed on a side of the substrate 1, the manufacturing method of the display panel further includes: a thin film transistor layer 6 is formed on a side of the substrate 1. The light-to-heat conversion layer 2 is located on a side of the thin film transistor layer 6 facing away from the substrate 1, and a reflective layer 8 and any one metal layer of the thin film transistor layer 6 are formed in a same process using a same material, saving the process.

Exemplarily, referring to FIG. 20, the thin film transistor layer 6 may include a plurality of thin film transistors, and each thin film transistor may include a source electrode 61, a drain electrode 62, a gate electrode 63, and a semiconductor layer 64. The light transmissive area A14 is not overlapped with the thin film transistors in the thin film transistor layer 6. The reflective layer 8 is formed in the same process using the same material as the source electrode 61 and the drain electrode 62. In other embodiments, the reflective layer 8 may also be formed in the same process using the same material as the gate electrode 63. In one embodiment, in other embodiments, the reflective layer 8 may also not be formed in the light transmissive area A14.

Figure 24:
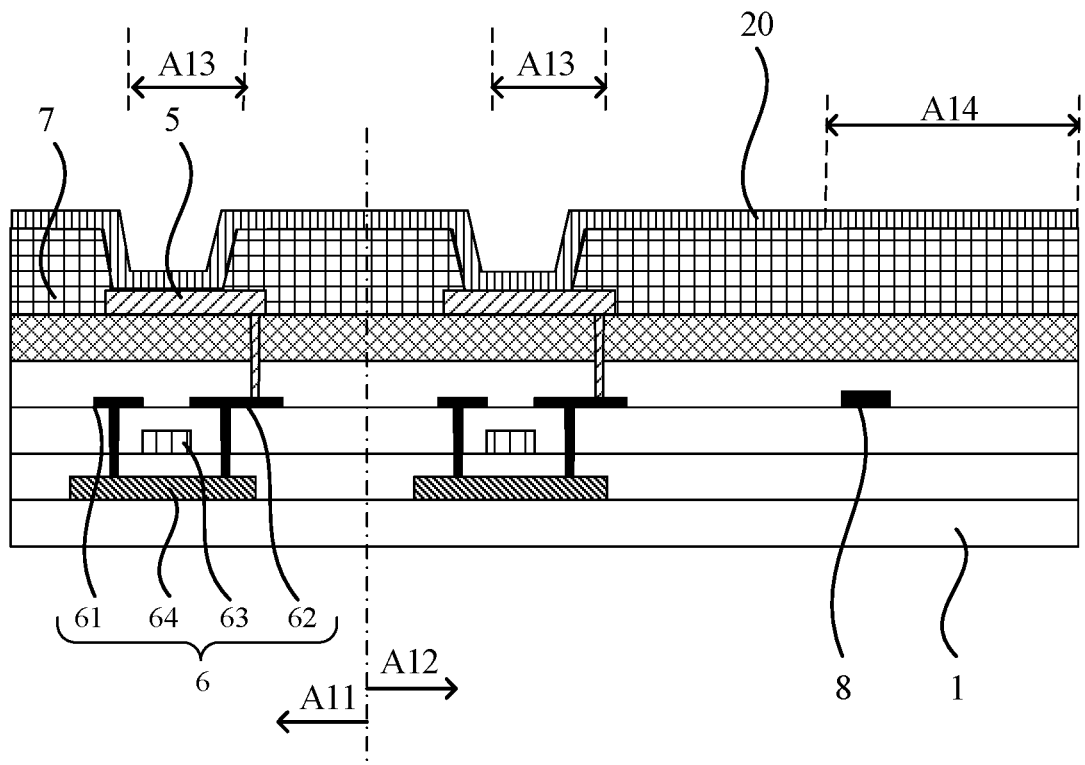
Figure 25:
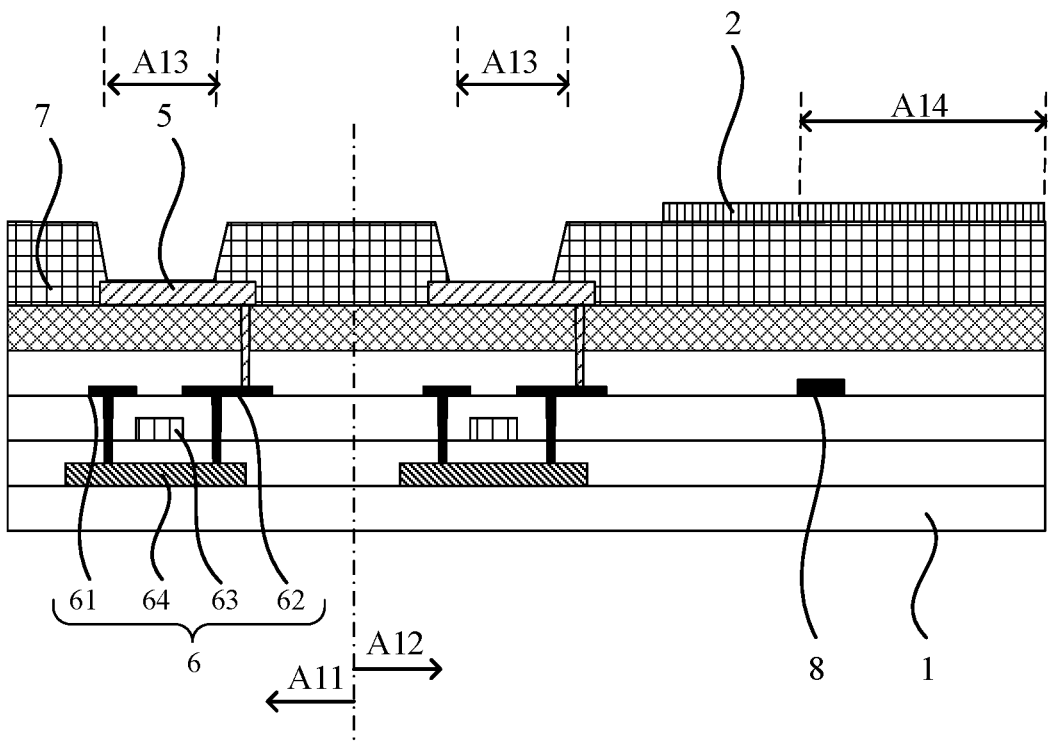
Figure 26:
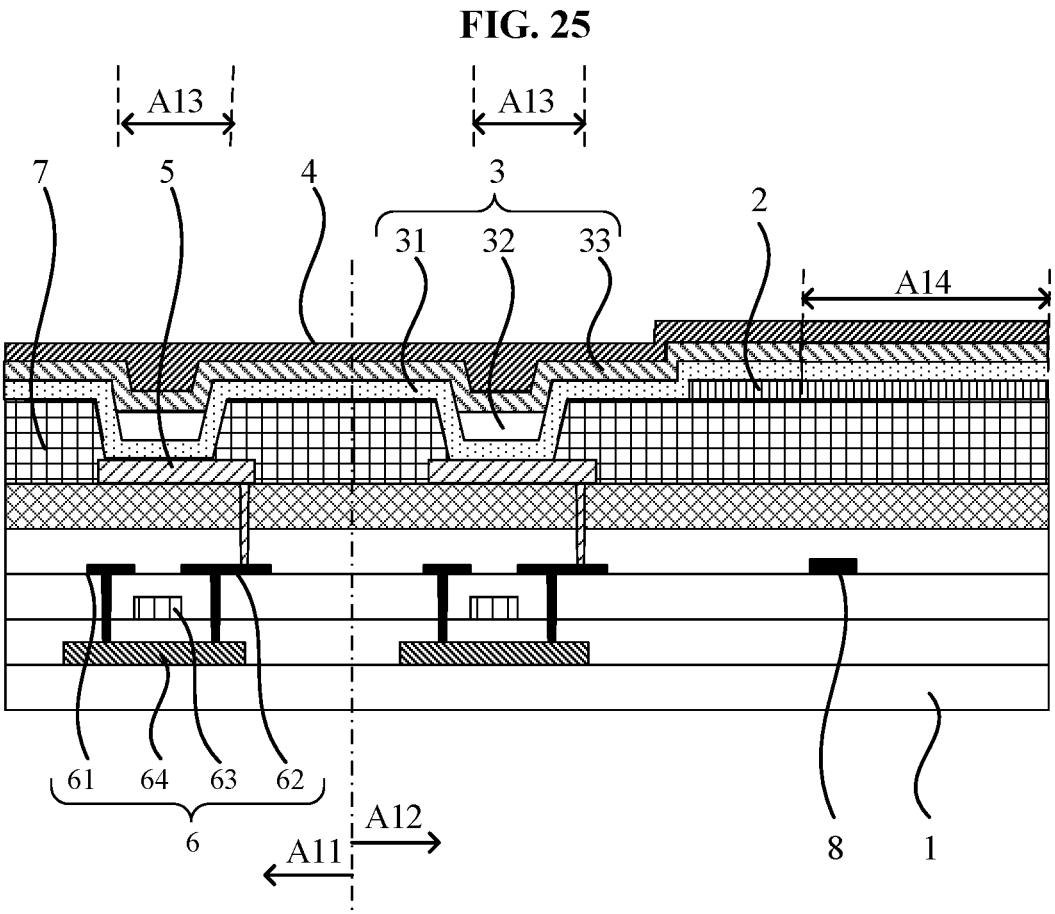
Figure 27:
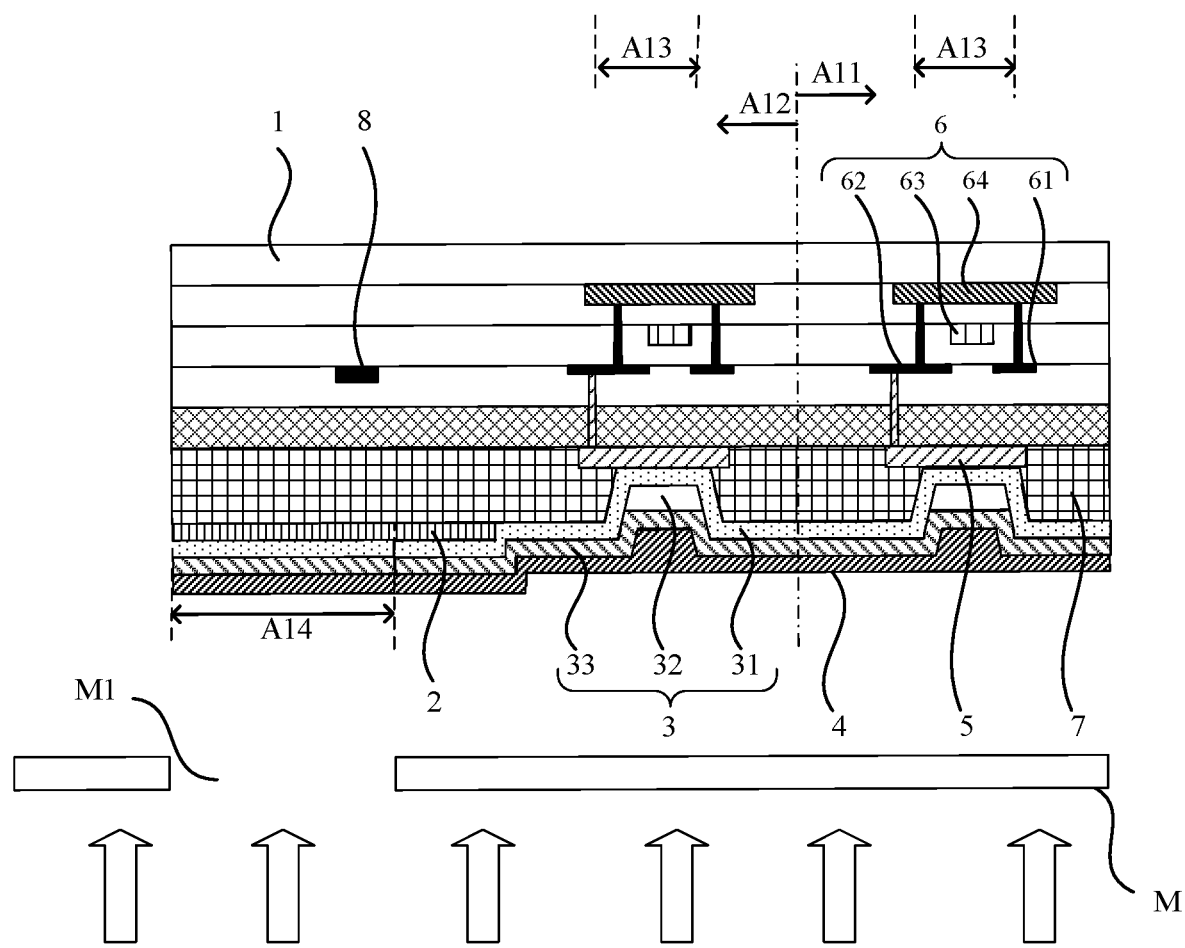
Figure 28:
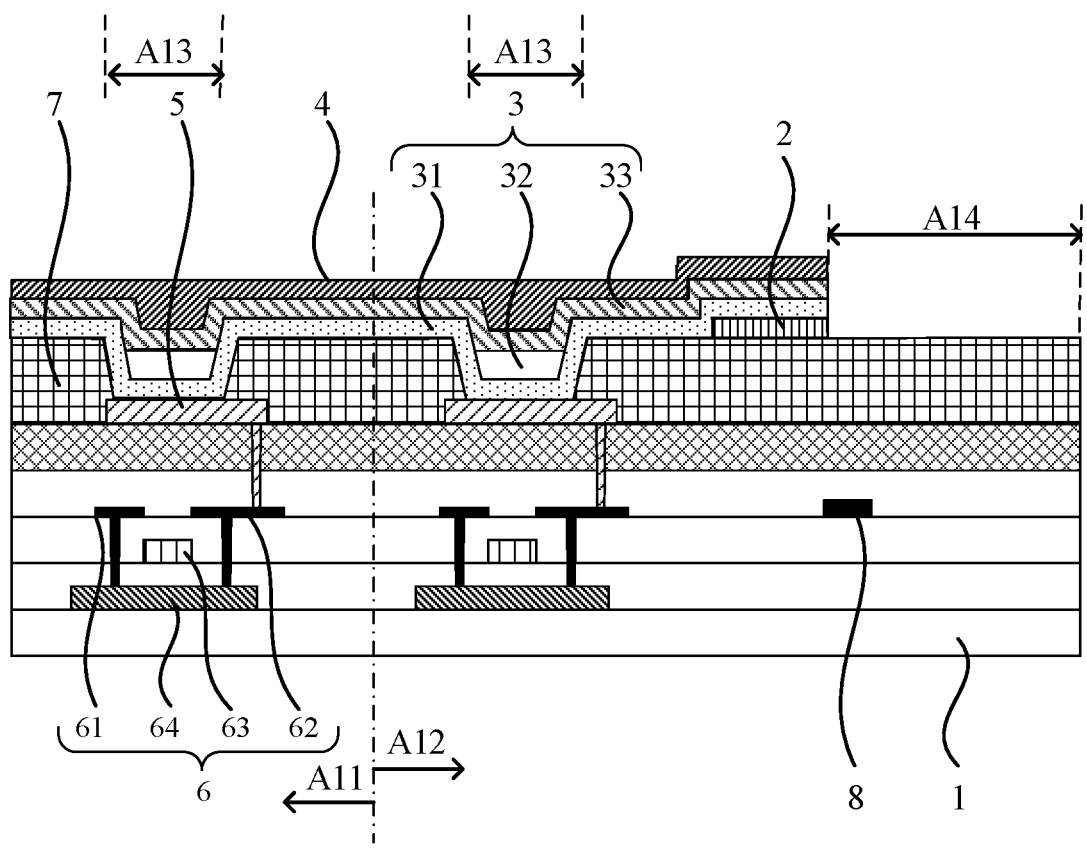

In one embodiment, referring to FIG. 24 and FIG. 25, the step of forming the light-to-heat conversion layer 2 covering at least the second display area A12 on the side of the substrate 1 includes that a light-to-heat conversion film layer 20 is formed on the side of the substrate 1, and that the light-to-heat conversion film layer 20 is patterned to form the light-to-heat conversion layer 2, where the light-to-heat conversion layer 2 is not overlapped with the light-emitting area A13.

Figure 29:
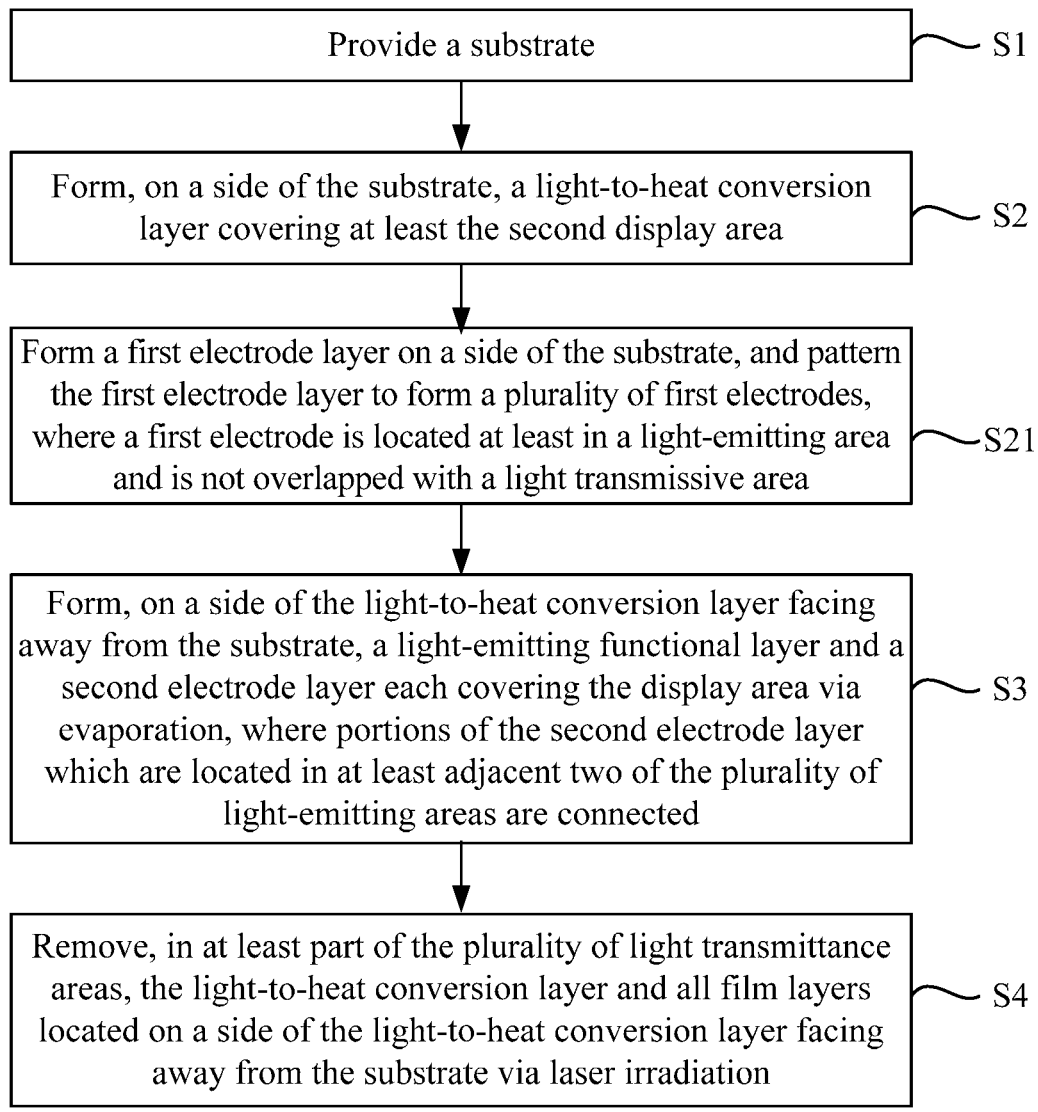
FIG. 29 is a flowchart illustrating another manufacturing method of a display panel according to an embodiment of the present disclosure.
Figure 30:
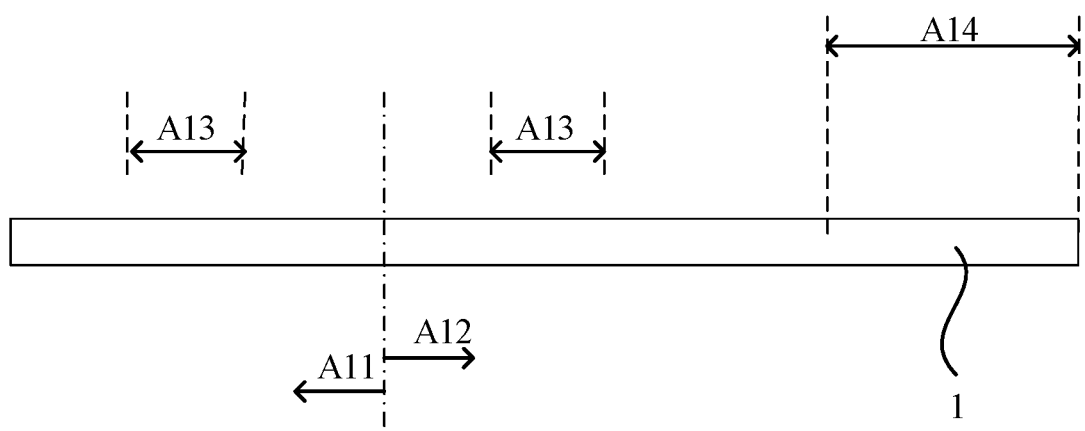
FIGS. 30 to 38 are schematic diagrams illustrating a manufacturing process of the display panel corresponding to the manufacturing method of the display panel of FIG. 29.

FIG. 29 is a flowchart illustrating another manufacturing method of a display panel according to an embodiment of the present disclosure, and FIGS. 30 to 38 are schematic diagrams illustrating a manufacturing process of the display panel corresponding to the manufacturing method of the display panel of FIG. 29. Referring to FIG. 29 and FIGS. 30 to 38, the manufacturing method of the display panel includes steps described below.

In S1, a substrate 1 is provided.

In S2, a light-to-heat conversion layer 2 covering at least the second display area A12 is formed on a side of the substrate 1.

In S21, a first electrode layer 50 is formed on a side of the substrate 1, and the first electrode layer 50 is patterned to form a plurality of first electrodes 5, where the first electrode 5 is located at least in a light-emitting area A13 and is not overlapped with the light transmissive area A14.

Figure 32:
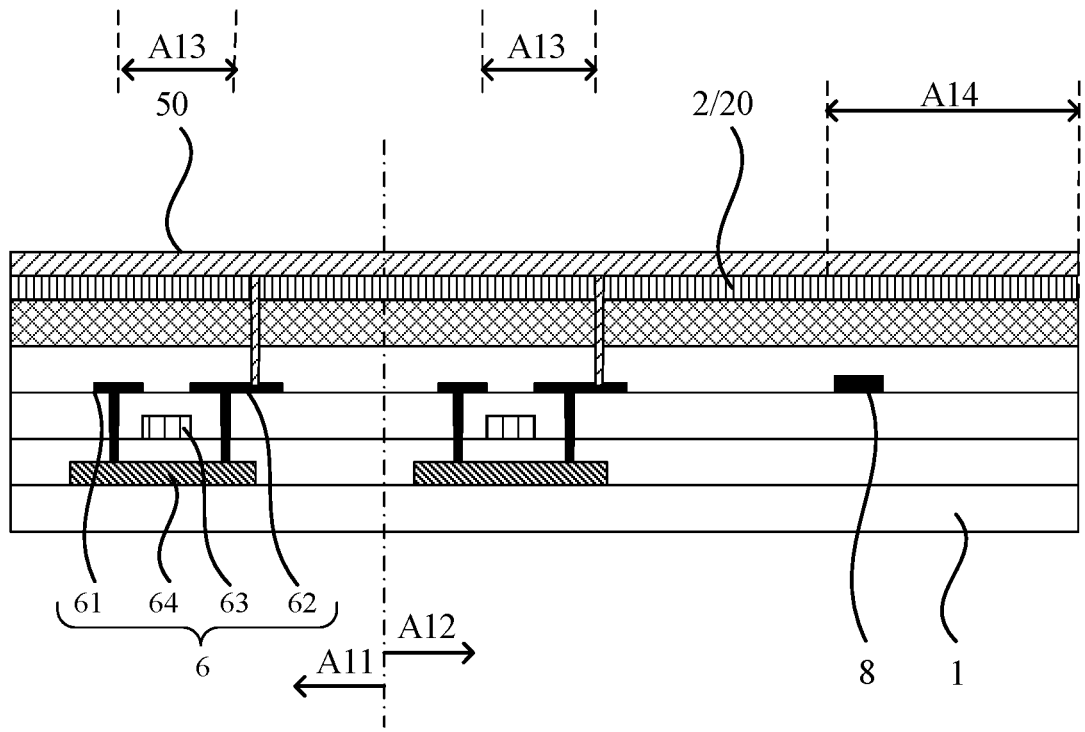

Referring to FIG. 32, the first electrode layer 50 covering a first display area A11 and a second display area A12 is formed on a side of the light-to-heat conversion layer 2 facing away from the substrate 1.

Figure 33:
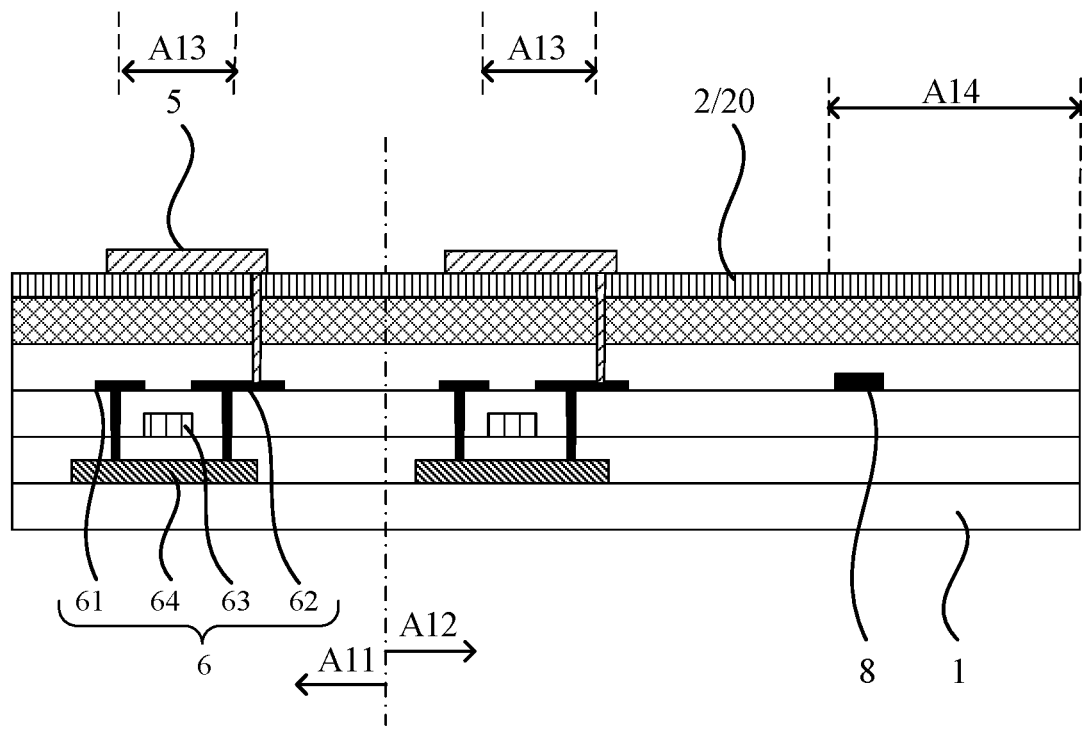

Referring to FIG. 33, the first electrode layer 50 is patterned to form a plurality of first electrodes 5. At least a portion of the first electrode 5 is located in the light-emitting area A13 of the first display area A11 or in the light-emitting area A13 of the second display area A12.

In S3, a light-emitting functional layer 3 and a second electrode layer 4 each covering the display area are formed via evaporation on a side of the light-to-heat conversion layer 2 facing away from the substrate 1, where portions of the second electrode layer 4 which are located in at least adjacent two light-emitting areas A13 are connected.

In S4, in at least part of the light transmissive areas A14, the light-to-heat conversion layer 2 and all film layers located on a side of the light-to-heat conversion layer 2 facing away from the substrate 1 are removed via laser irradiation.

In the embodiment of the present disclosure, the light-to-heat conversion layer is formed before the formation of the first electrode layer, and the light-to-heat conversion layer is located between the first electrode layer and the substrate, light-to-heat is not located between the first electrode (the first electrode is formed by patterning the first electrode layer) and the second electrode layer, and does not affect the transmission of a hole injected from the first electrode, so that after an entire layer of the light-to-heat conversion layer is formed, it is not necessary to remove the light-to-heat conversion layer of the light-emitting area A13, saving the process.

Figure 31:
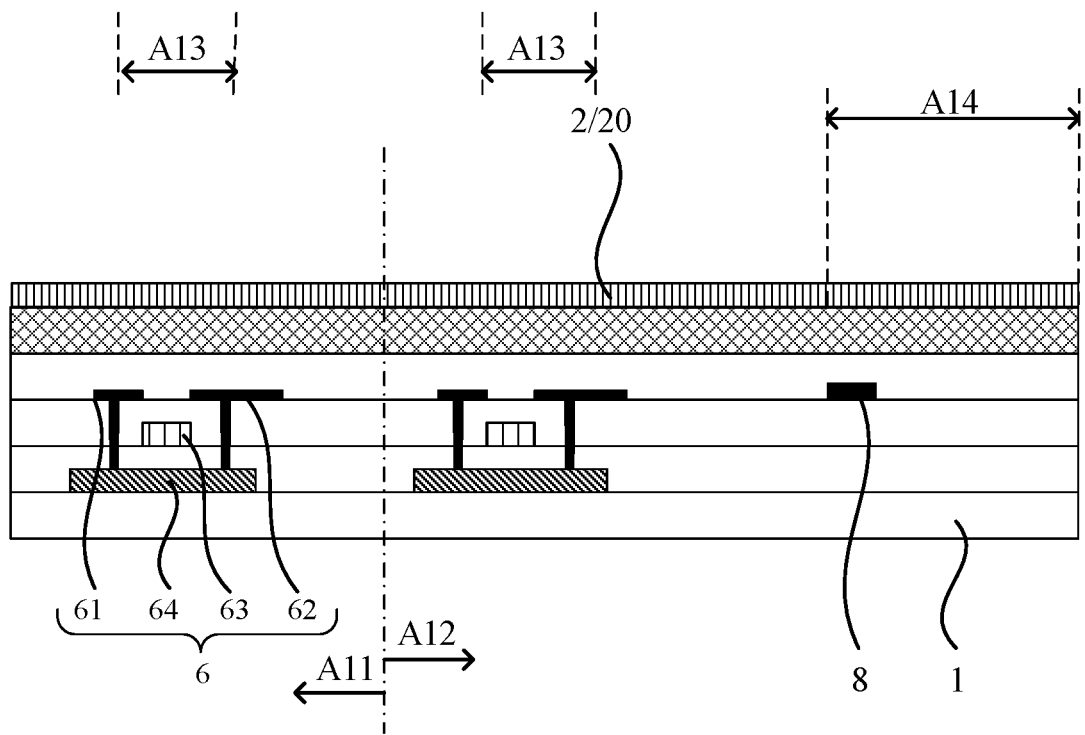

In one embodiment, referring to FIG. 31, before forming the light-to-heat conversion layer 2 covering at least the second display area A12 on a side of the substrate 1, forming a reflective layer 8 at an edge of a respective one of at least part of the light transmissive areas A14 is further included. Since a reflective layer 8 is located at the edge of a respective one of the at least part of the light transmissive areas A14 and between the light-to-heat conversion layer 2 and the substrate 1, when the light-to-heat conversion layer 2 in the light transmissive area A14 is irradiated with the laser, the reflective layer 8 reflects the light transmitted through the light-to-heat conversion layer 2 to the light-to-heat conversion layer 2 again, improving the utilization rate of the irradiation laser, accelerating the expansion rate of the light-to-heat conversion layer 2 at the edge of the light transmissive area A14, facilitating the detachment of the light-to-heat conversion layer 2 and all film layers located on a side of the light-to-heat conversion layer 2 facing away from the substrate 1 in the light transmissive area A14, and a reflective layer 8 is merely located at the edge of a light transmissive area A14, which reduces the influence on the light transmittance of the light transmissive area A14.

In one embodiment, referring to FIG. 31, before the first electrode layer 50 is formed on a side of the substrate 1, the manufacturing method of the display panel further includes: a thin film transistor layer 6 is formed on a side of the substrate 1. The light-to-heat conversion layer 2 is located on a side of the thin film transistor layer 6 facing away from the substrate 1, and a reflective layer 8 and any one metal layer of the thin film transistor layer 6 are formed in a same process using a same material, saving the process.

Figure 34:
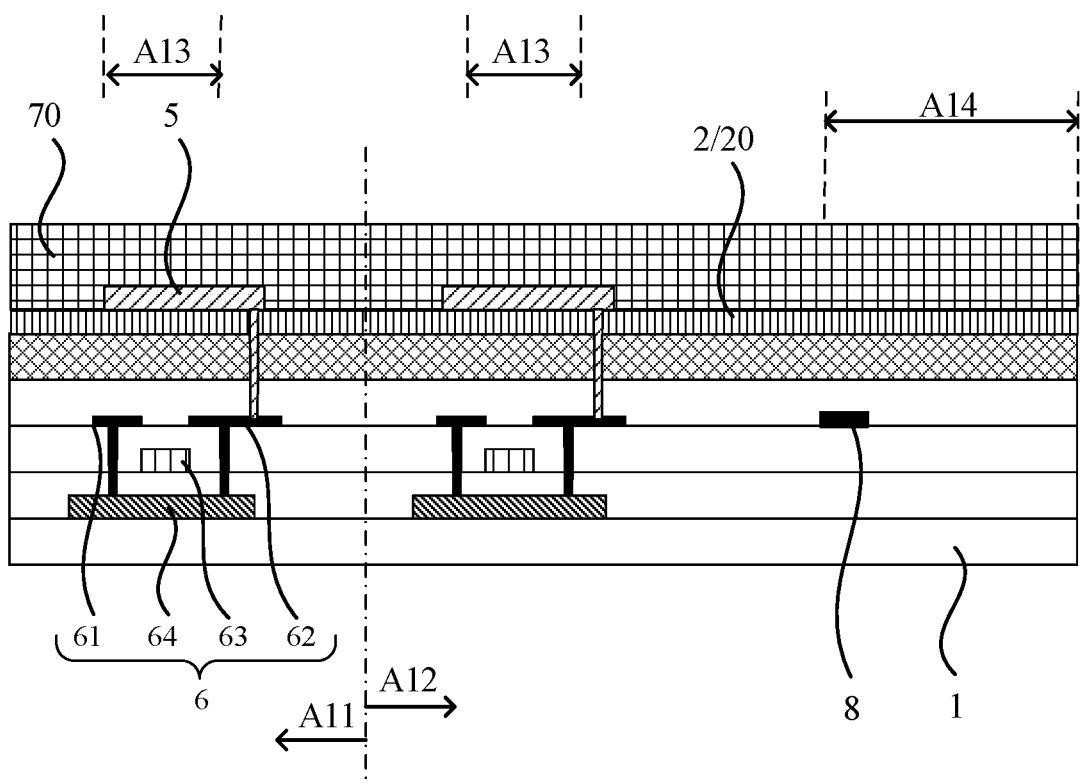
Figure 35:
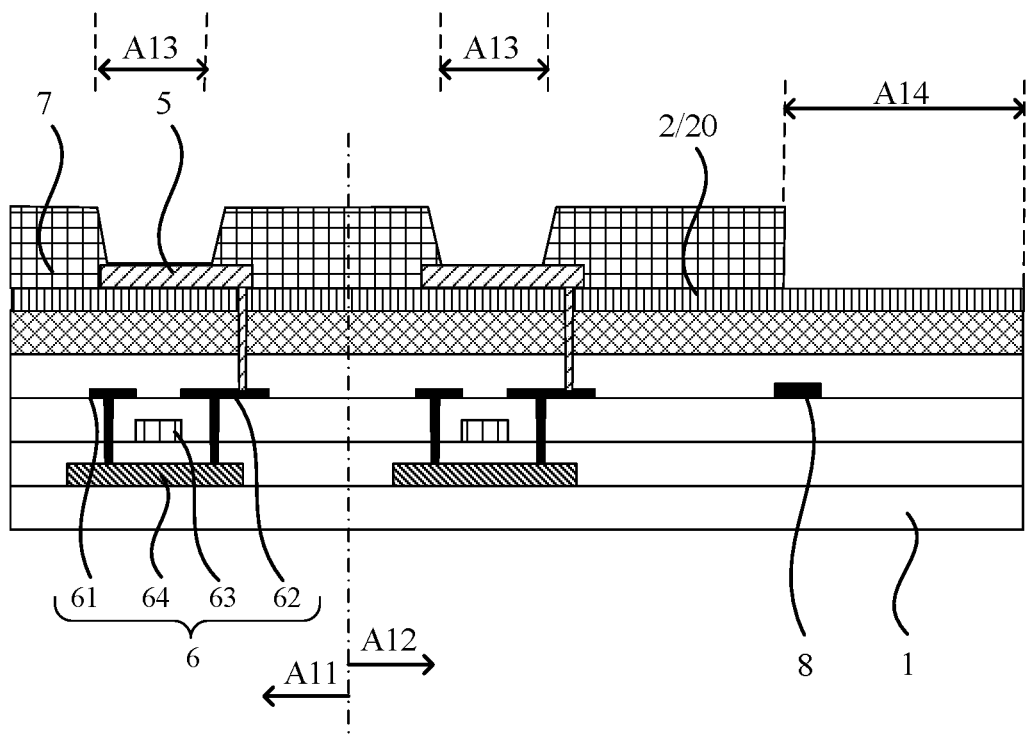
Figure 36:
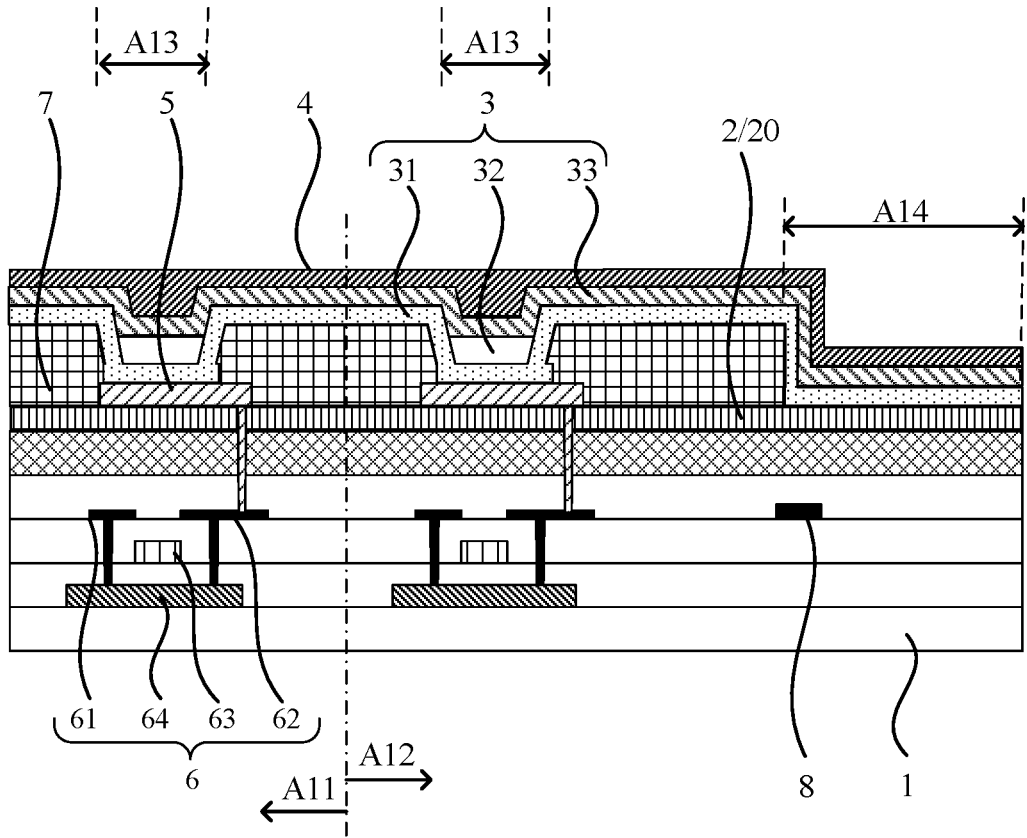
Figure 37:
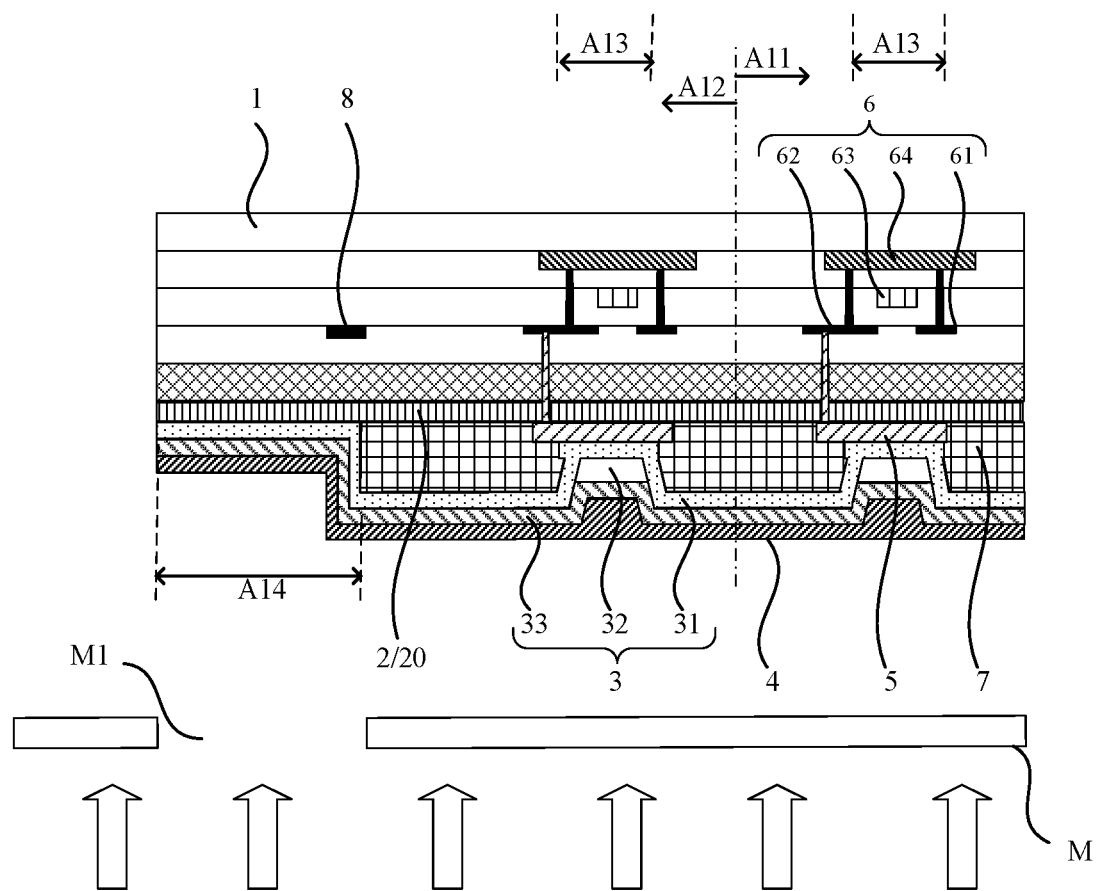
Figure 38:
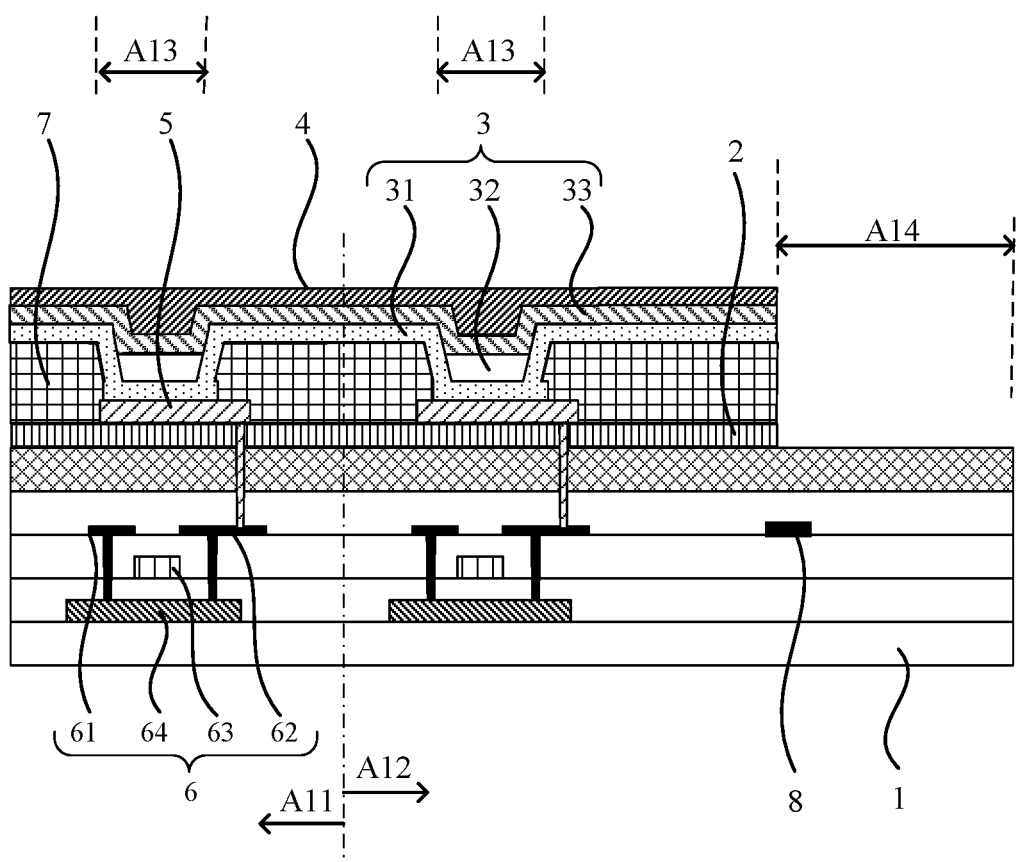

In one embodiment, referring to FIG. 34 and FIG. 35, a pixel defining film layer 70 covering the first display area A11 and the second display area A12 is formed on a side of the first electrode 5 facing away from the substrate 1 and is patterned to form a pixel defining layer 7. The pixel defining layer 7 is provided with a plurality of openings, and an opening is located in a light-emitting area A13. The opening is also located in the light transmissive area A14, and exposes the light-to-heat conversion layer 2 of the light transmissive area A14, avoiding the pixel defining layer 7 from affecting the thermal expansion and detachment of the light-to-heat conversion layer 2 in the light transmissive area A14.

In one embodiment, in an embodiment, the entire layer of the light-to-heat conversion layer 2 as shown in FIG. 31 may not be formed, but the patterned light-to-heat conversion layer 2 may be formed. That is, the step of forming the light-to-heat conversion layer 2 covering at least the second display area A12 on a side of the substrate 1 includes that a light-to-heat conversion film layer 20 is formed on a side of the substrate 1, and that the light-to-heat conversion film layer 20 is patterned to form the light-to-heat conversion layer 2, where the light-to-heat conversion layer 2 is not overlapped with the light-emitting area A13.

In one embodiment, in another embodiment, the first electrode layer 50 covering the first display area A11 and the second display area A12 may be formed first, and the first electrode layer 50 is patterned to form the first electrode 5 located in the light-emitting area A13. Then the light-to-heat conversion film layer 20 covering the second display area A12 is formed, and the light-to-heat conversion film layer 20 on the first electrode 5 in the second display area A12 is removed to form the patterned light-to-heat conversion layer 2. Then the pixel defining film layer 70 covering the first display area A11 and the second display area A12 is formed, and the pixel defining film layer 70 is patterned to form a pixel defining layer 7, where the pixel defining layer 7 is provided with a plurality of openings, and an opening is located in a light-emitting area A13. The opening is also located in the light transmissive area A14, and exposes the light-to-heat conversion layer 2 of the light transmissive area A14, avoiding the pixel defining layer 7 from affecting the thermal expansion and detachment of the light-to-heat conversion layer 2 in the light transmissive area A14.

In one embodiment, the step of forming the light-to-heat conversion layer 2 covering at least the second display area A12 on a side of the substrate 1 includes: forming the light-to-heat conversion layer 2 through a laser printing process. Since the patterned light-to-heat conversion layer 2 may be directly formed via laser printing, the patterned light-to-heat conversion layer 2 is not overlapped with the light-emitting areas A13 in the first display area A11 and the second display area A12. The process is saved in comparison with first formation of the entire layer of the light-to-heat conversion film layer 20 and then patterning processing of the light-to-heat conversion film layer 20.

Figure 39:
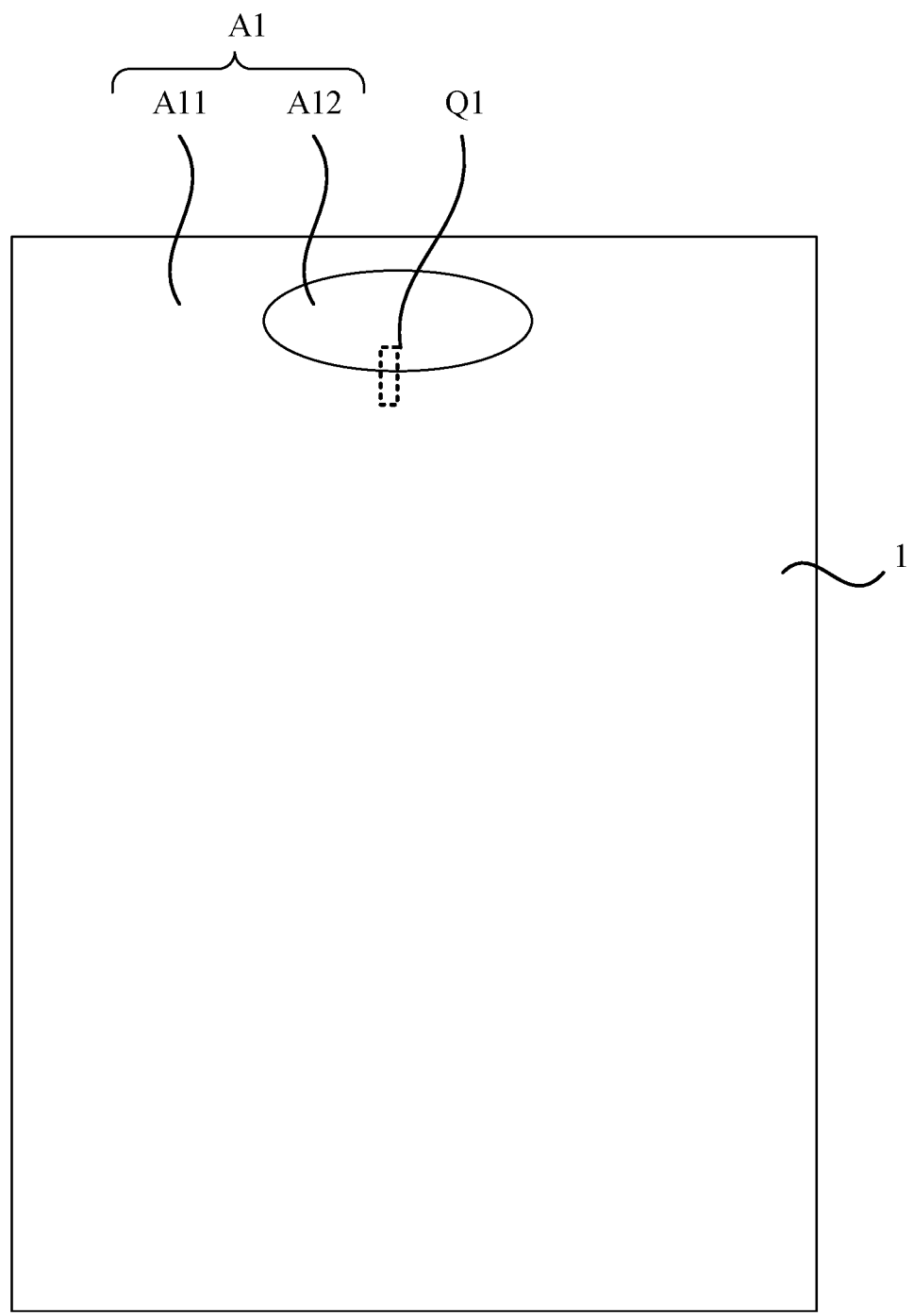
FIG. 39 is a schematic top view of a display panel according to an embodiment of the present disclosure.
Figure 40:
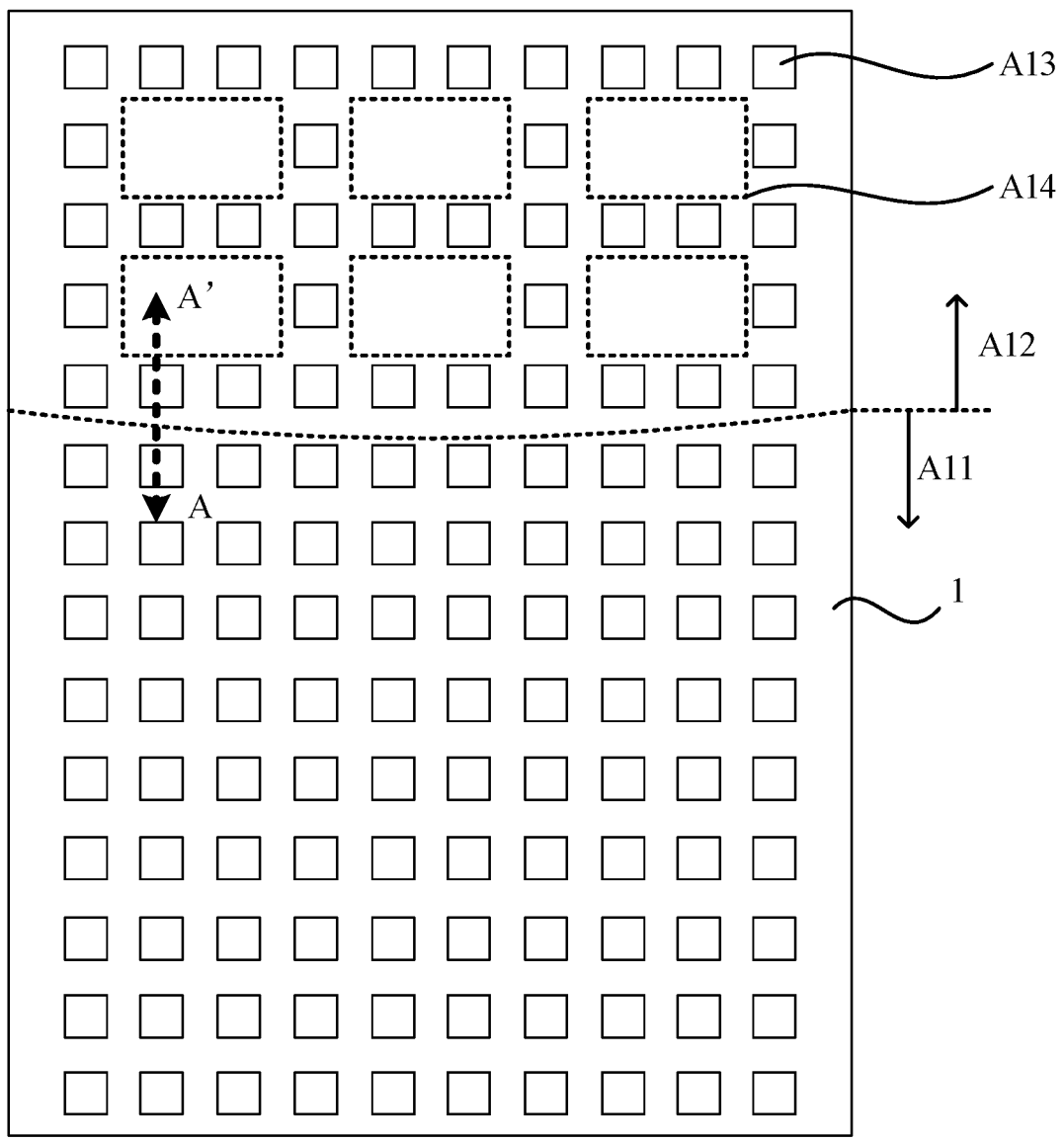
FIG. 40 is a schematic enlarged view of area Q1 of FIG. 39.
Figure 41:
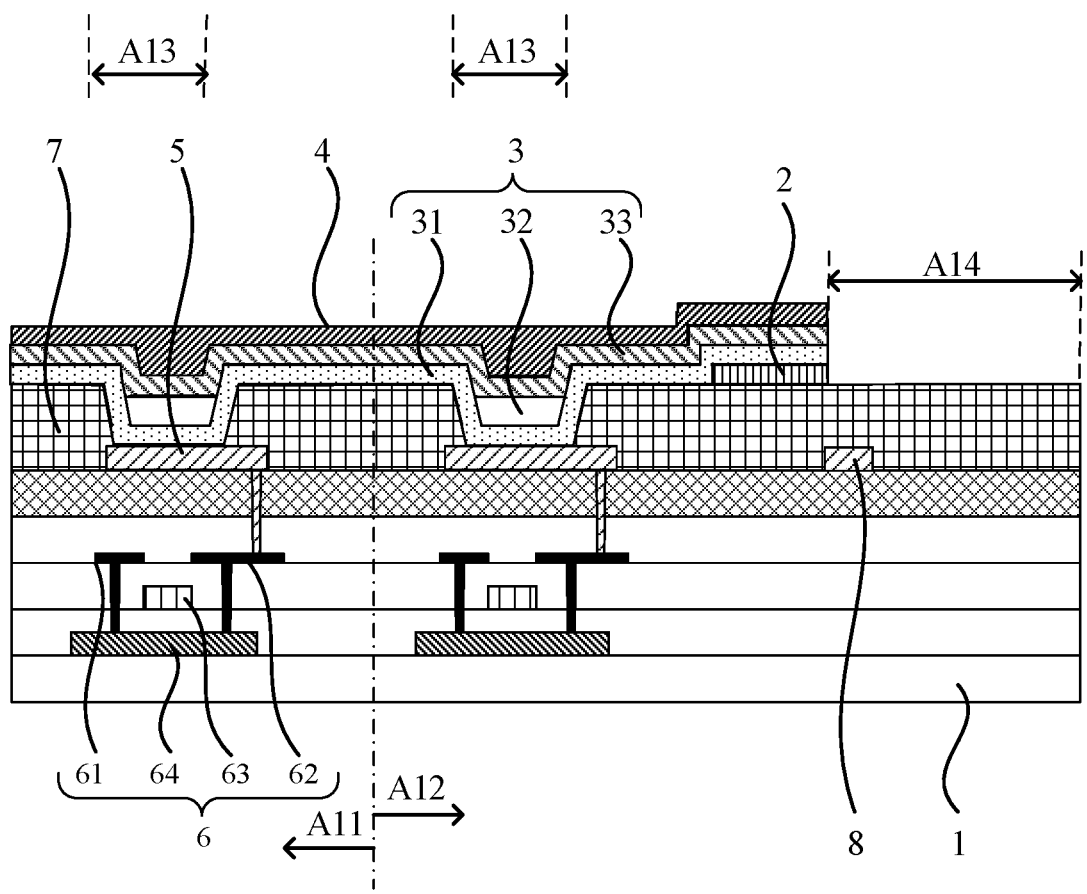
FIG. 41 is a schematic cross-sectional view of FIG. 40 taken along section AA'.
Figure 42:
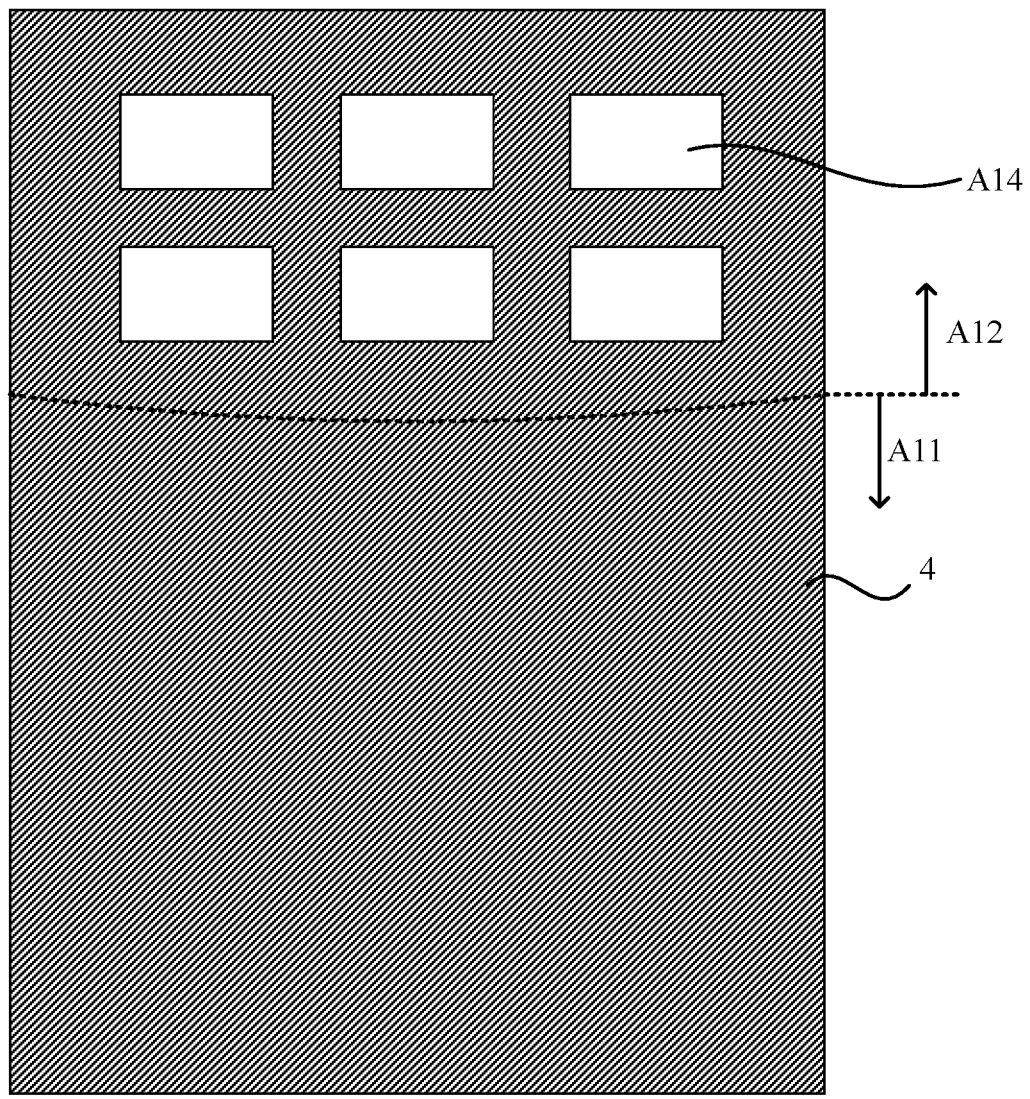
FIG. 42 is a schematic top view of a second electrode according to an embodiment of the present disclosure.

FIG. 39 is a schematic top view of a display panel according to an embodiment of the present disclosure, FIG. 40 is a schematic enlarged view of area Q1 of FIG. 39, FIG. 41 is a schematic cross-sectional view of FIG. 40 taken along section AA', and FIG. 42 is a schematic top view of a second electrode according to an embodiment of the present disclosure. Referring to FIGS. 39, 40, 41, and 42, the display panel includes a display area A1, the display area A1 includes a first display area A11 and a second display area A12, and the second display area A12 is reused as a light sensing element setting area. The first display area A11 and the second display area A12 each include a plurality of light-emitting areas A13, and the second display area A12 further includes a plurality of light transmissive areas A14. The display panel includes a substrate 1 and the light-to-heat conversion layer 2, the light-emitting functional layer 3, and the second electrode layer 4 which are located on a side of the substrate 1 and are sequentially disposed. Portions of the second electrode layer 4 which are located in at least adjacent two light-emitting areas A13 are connected. The light-to-heat conversion layer 2, the light-emitting functional layer 3, and the second electrode layer 4 are not overlapped with at least part of the light transmissive areas A14.

In the display panel provided in the embodiment of the present disclosure, the light-emitting functional layer and the second electrode layer which are located in the light transmissive area are peeled off from the substrate, and the light transmissive area has no light-emitting functional layer and second electrode layer, improving the light transmittance performance of the light transmissive area, that is, the light transmittance of the light transmissive area is increased, the light transmittance performance of the light sensing element setting area is improved, and the purpose of increasing the transmittance is achieved. The method of peeling off the light-emitting functional layer and the second electrode layer from the substrate in the light transmissive area may be achieved by using the manufacturing method of the display panel in any one of the above embodiments.

In one embodiment, referring to FIG. 41, the display panel further includes reflective layers 8, and the film layer where the reflective layers 8 are located is located between the light-to-heat conversion layer 2 and the substrate 1, and a reflective layer 8 is located at an edge of a respective one of at least part of the light transmissive areas A14. When the light-to-heat conversion layer 2 of the light transmissive area A14 is irradiated with laser, the reflective layer 8 reflects the light transmitted through the light-to-heat conversion layer 2 to the light-to-heat conversion layer 2 again, increasing the utilization rate of the irradiation laser and accelerating the expansion rate of the light-to-heat conversion layer 2 at an edge of the light transmissive area A14, thereby, in the manufacturing process of the display panel, facilitating the detachment of the light-to-heat conversion layer 2 and all film layers located on a side of the light-to-heat conversion layer 2 facing away from the substrate 1 in the light transmissive area A14, and the reflective layer 8 is merely located at the edge of the light transmissive area A14, which reduces the influence on the light transmittance of the light transmissive area A14.

In one embodiment, referring to FIG. 41, the reflective layer 8 may be disposed in the same layer as the first electrode 5. In other embodiments, the reflective layer 8 and any one metal layer of the thin film transistor layer 6 may also be formed in a same process using a same material, saving the process.

In one embodiment, referring to FIG. 41, the display panel further includes the first electrodes 5, and a first electrode 5 is located at least in the light-emitting area A13 and is not overlapped with the light transmissive area A14. The film layer where the light-to-heat conversion layer 2 is located is located on a side of the film layer where the first electrode 5 is located facing away from the substrate 1, and the light-to-heat conversion layer 2 is not overlapped with the first electrode 5. In the embodiment of the present disclosure, the light-to-heat conversion layer 2 is not overlapped with the first electrode 5 and is not overlapped with the light-emitting area A13, and the case of adverse influence of the light-to-heat conversion layer 2 on light-emitting display is avoided, and the display effect of the display panel is ensured.

In one embodiment, referring to FIG. 41, the light-emitting functional layer 3 includes a first auxiliary light-emitting layer 31, a light-emitting material layer 32, and a second auxiliary light-emitting layer 33, and the light-emitting material layer 32 is formed in the opening of the pixel defining layer 7. The light-emitting material layer 32 is located between the first auxiliary light-emitting layer 31 and the second auxiliary light-emitting layer 33, the first auxiliary light-emitting layer 31 is located between the first electrode 5 and the light-emitting material layer 32, and the second auxiliary light-emitting layer 33 is located between the second electrode layer 4 and the light-emitting material layer 32. The light-emitting material layer 32 may include, for example, a red light-emitting material layer emitting red light, a green light-emitting material layer emitting green light, and a blue light-emitting material layer emitting blue light. The first auxiliary light-emitting layer 31 may include, for example, at least one of a hole injection layer, a hole transmission layer, or an electron blocking layer, and the second auxiliary light-emitting layer 33 may include, for example, at least one of a hole blocking layer, an electron transmission layer, or an electron injection layer. The removal of the light-emitting functional layer 3 in the light transmissive area A14 specifically refers to the removal of the first auxiliary light-emitting layer 31 and the second auxiliary light-emitting layer 33 in the light transmissive area A14.

In one embodiment, referring to FIG. 40 and FIG. 42, the second display area A12 includes a plurality of light transmissive areas A14, and the plurality of light transmissive areas A14 is arranged in a matrix. In other embodiments, the plurality of light transmissive areas A14 may also be arranged irregularly to prevent the grating diffraction effect formed when the plurality of light transmissive areas A14 is regularly arranged, avoiding the influence on the light passing through the light transmissive area A14.

Figure 43:
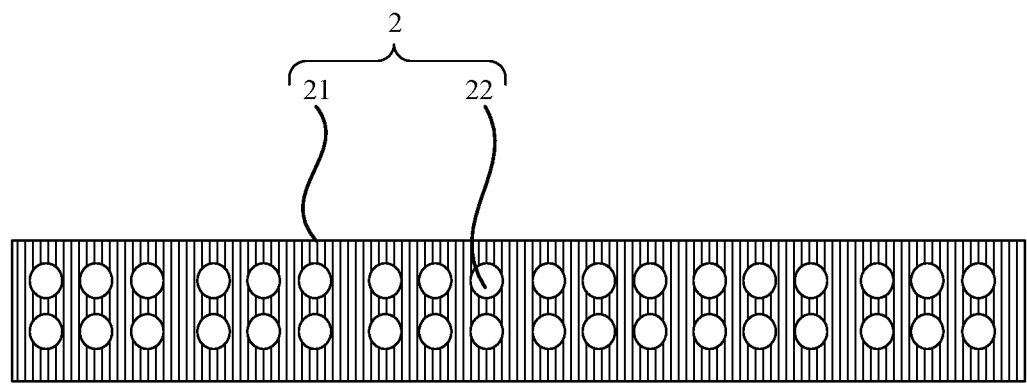
FIG. 43 is a schematic structural diagram of a light-to-heat conversion layer according to an embodiment of the present disclosure.

FIG. 43 is a schematic structural diagram of a light-to-heat conversion layer according to an embodiment of the present disclosure. Referring to FIG. 43, the light-to-heat conversion layer 2 includes a base layer 21 and light-to-heat conversion particles 22 located in the base layer 21. The light-to-heat conversion particles 22 convert the light energy into thermal energy upon receiving the irradiated laser and transfer the thermal energy to the base layer 21, and the base layer 21 is thermally expanded to detach from the substrate 1 under the action of gravity.

Figure 44:
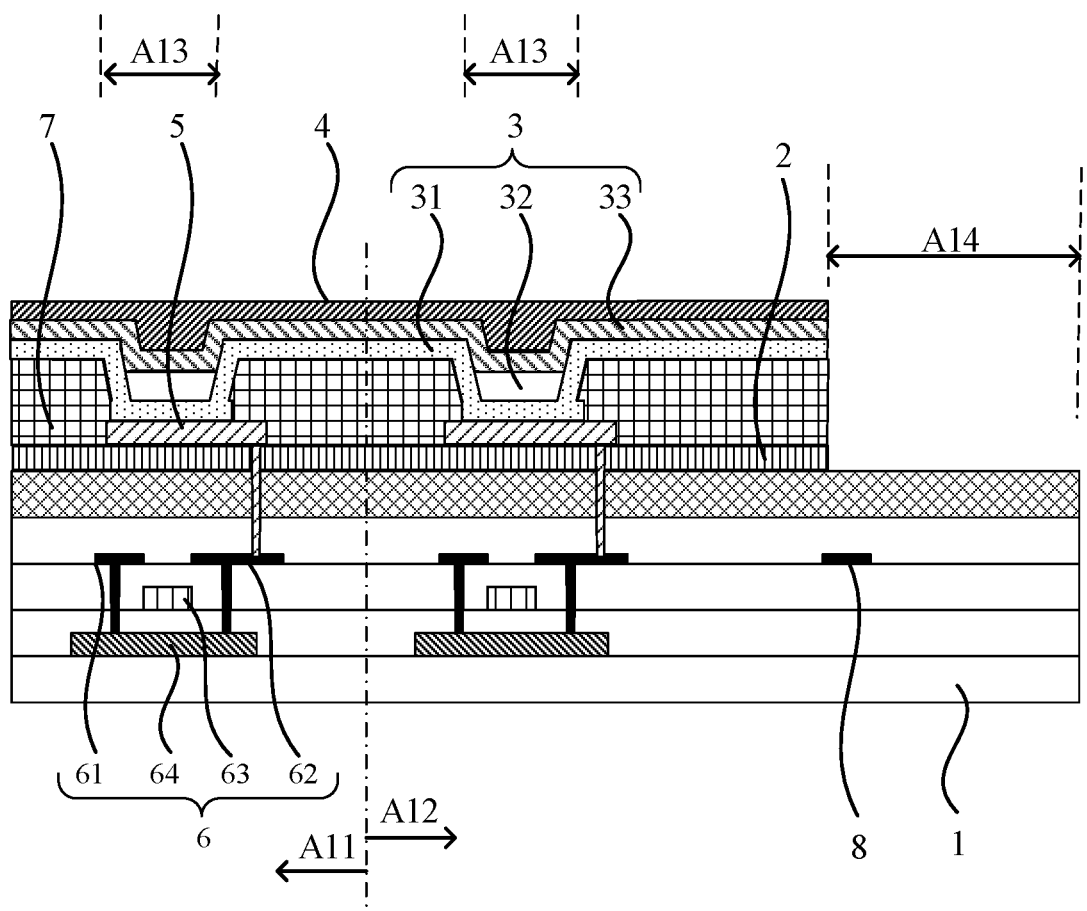
FIG. 44 is a schematic cross-sectional view of another display panel according to an embodiment of the present disclosure.

FIG. 44 is a schematic cross-sectional view of another display panel according to an embodiment of the present disclosure. Referring to FIG. 44, a display panel further includes first electrodes 5, and a first electrode 5 is located at least in a light-emitting area A13 and is not overlapped with a light transmissive area A14. The film layer where a light-to-heat conversion layer 2 is located is located between the film layer where the first electrode 5 is located and a substrate 1. The opening of a pixel defining layer 7 is located in the light-emitting area A13, and the opening of the pixel defining layer 7 is also located in the light transmissive area A14. That is, in the embodiment of the present disclosure, the material of the pixel defining layer 7 in the light transmissive area A14 is also removed, further improving the light transmittance performance of the light transmissive area A14.

Figure 45:
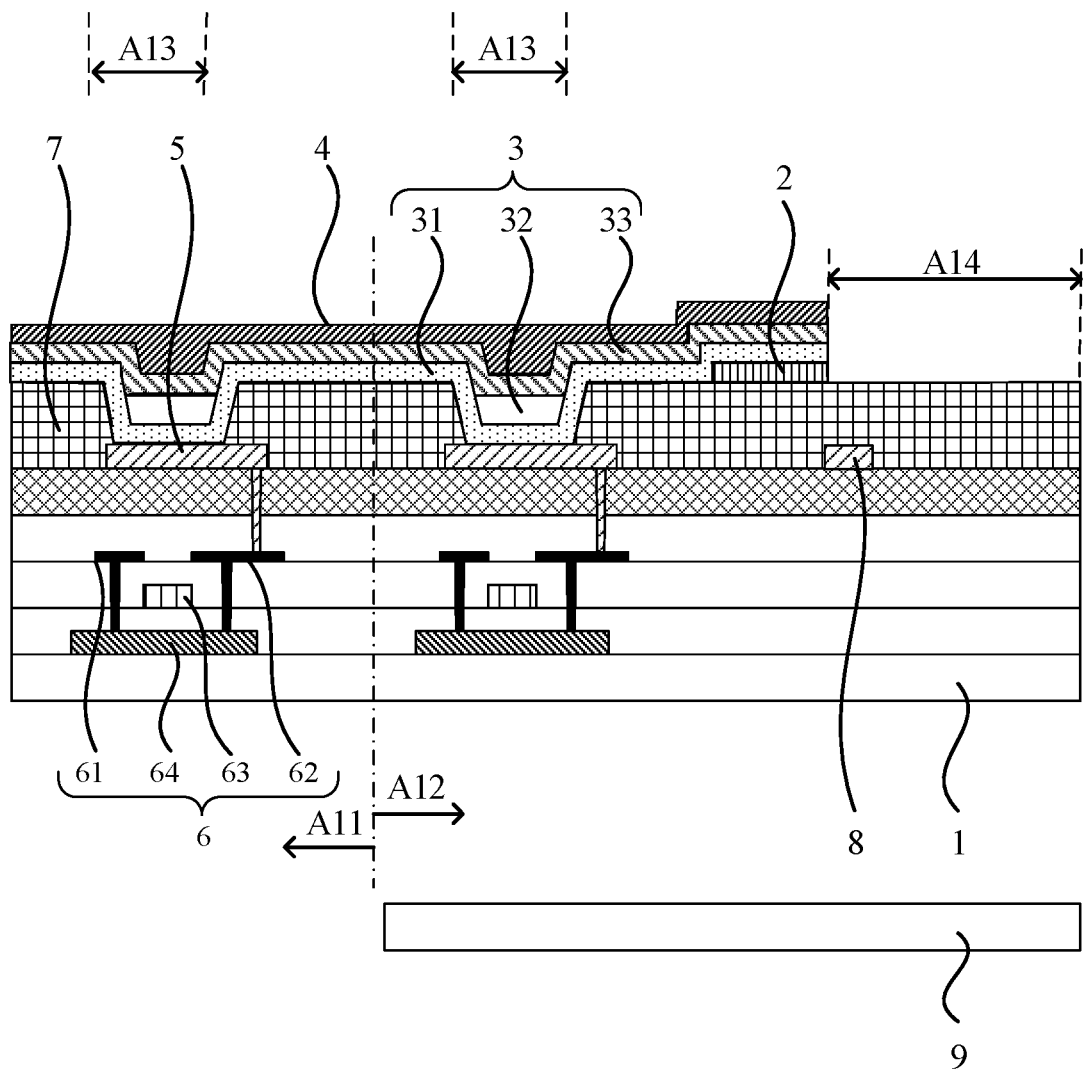
FIG. 45 is a schematic cross-sectional view of a display device according to an embodiment of the present disclosure.

The embodiments of the present disclosure further provide a display device. FIG. 45 is schematic cross-sectional view of a display device according to an embodiment of the present disclosure. As shown in FIG. 45, the display device provided in the embodiment of the present disclosure includes the display panel according to any embodiment of the present disclosure and a light sensing element 9 located in the second display area A12. The light sensing element 9 is located on a side of the substrate 1 facing away from the light-to-heat conversion layer 2, and the photosensitive surface of the light sensing element 9 faces toward the substrate 1. The light sensing element 9 may be an optical element or a photoelectric element, and the external ambient light penetrates the display panel portion of the light transmissive area A14 in the second display area A12 to reach the light sensing element 9. Since the display device provided in the embodiment of the present disclosure includes the display panel according to any embodiment of the present disclosure, the display device provided in the embodiment of the present disclosure allows more external ambient light to reach the light sensing element 9 to implement better functions, such as optical imaging or optical detection. The display device provided in the embodiment of the present disclosure may be a mobile phone, or may be a computer, a television, a smart wearable display device, or the like, which is not specifically limited in the embodiment of the present disclosure.

What is claimed is:

1. A display panel, comprising:
a display area, wherein the display area comprises a first display area and a second display area; wherein the second display area is reused as a light sensing element setting area; wherein the first display area and the second display area each comprise a plurality of light-emitting areas, and the second display area further comprises a plurality of light transmissive areas; and
wherein the display panel comprises:
a substrate; and
a light-to-heat conversion layer, a light-emitting functional layer, and a second electrode layer, wherein the light-to-heat conversion layer, the light-emitting functional layer, and the second electrode layer are located on a side of the substrate and sequentially disposed;
wherein the light-to-heat conversion layer, the light-emitting functional layer, and the second electrode layer are not overlapped with at least part of the plurality of light transmissive areas;
wherein the display panel further comprises a plurality of first electrodes, wherein each of the plurality of first electrodes is located at least in a corresponding light-emitting area of the plurality of light-emitting areas, and is not overlapped with the plurality of light transmissive areas; and
wherein a film layer where the light-to-heat conversion layer is located is located on a side of a film layer where the first electrode is located facing away from the substrate, and the light-to-heat conversion layer is not overlapped with the plurality of first electrodes.

2. The display panel of claim 1, further comprising:
a plurality of reflective layers, wherein a film layer where the plurality of reflective layers is located is located between the light-to-heat conversion layer and the substrate, and each of the plurality of reflective layers is located at an edge of a respective one of at least part of the plurality of light transmissive areas.

3. A display device, comprising:
a display panel and a light sensing element located in the second display area;
wherein the display panel comprises a display area, wherein the display area comprises a first display area and a second display area; wherein the second display area is reused as a light sensing element setting area; wherein the first display area and the second display area each comprise a plurality of light-emitting areas, and the second display area further comprises a plurality of light transmissive areas;
wherein the display panel comprises a substrate, a light-to-heat conversion layer, a light-emitting functional layer, and a second electrode layer, wherein the light-to-heat conversion layer, the light-emitting functional layer, and the second electrode layer are located on a side of the substrate and sequentially disposed, wherein portions of the second electrode layer which are located in at least adjacent two of the plurality of light-emitting areas are connected;
wherein the light-to-heat conversion layer, the light-emitting functional layer, and the second electrode layer are not overlapped with at least part of the plurality of light transmissive areas; and
wherein the light sensing element is located on a side of the substrate facing away from the light-to-heat conversion layer, and a photosensitive surface of the light sensing element faces toward the substrate.

4. The display device of claim 3, wherein the display panel further comprises:
a plurality of reflective layers, wherein a film layer where the plurality of reflective layers is located is located between the light-to-heat conversion layer and the substrate, and each of the plurality of reflective layers is located at an edge of a respective one of at least part of the plurality of light transmissive areas.

5. The display device of claim 3, wherein the display panel further comprises:
a plurality of first electrodes, wherein each of the plurality of first electrodes is located at least in a corresponding light-emitting area of the plurality of light-emitting areas, and is not overlapped with the plurality of light transmissive areas;

wherein a film layer where the light-to-heat conversion layer is located is located on a side of a film layer where the first electrode is located facing away from the substrate, and the light-to-heat conversion layer is not overlapped with the plurality of first electrodes.

\* \* \* \* \*